(12) United States Patent
Noguchi

(10) Patent No.: US 12,107,563 B2
(45) Date of Patent: Oct. 1, 2024

(54) ACOUSTIC WAVE FILTER AND MULTIPLEXER

(71) Applicant: Murata Manufacturing Co., Ltd., Nagaokakyo (JP)

(72) Inventor: Akira Noguchi, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 459 days.

(21) Appl. No.: 17/574,604

(22) Filed: Jan. 13, 2022

(65) Prior Publication Data

US 2022/0140809 A1 May 5, 2022

Related U.S. Application Data

(63) Continuation of application No. PCT/JP2020/027273, filed on Jul. 13, 2020.

(30) Foreign Application Priority Data

Jul. 17, 2019 (JP) ................. 2019-131525

(51) Int. Cl.
*H03H 9/145* (2006.01)
*H03H 9/25* (2006.01)
*H03H 9/64* (2006.01)
*H03H 9/72* (2006.01)

(52) U.S. Cl.
CPC ......... *H03H 9/14544* (2013.01); *H03H 9/25* (2013.01); *H03H 9/6483* (2013.01); *H03H 9/72* (2013.01)

(58) Field of Classification Search
CPC ........... H03H 9/145; H03H 9/25; H03H 9/64; H03H 9/72
See application file for complete search history.

(56) References Cited

U.S. PATENT DOCUMENTS

| | | | | |
|---|---|---|---|---|
| 7,679,474 B2 * | 3/2010 | Igaki | ................. | H03H 9/6483 333/195 |
| 7,847,657 B2 * | 12/2010 | Takahashi | .......... | H03H 9/14535 333/195 |
| 7,902,716 B2 * | 3/2011 | Tanaka | ................. | H03H 9/0274 310/313 C |
| 8,344,815 B2 * | 1/2013 | Yamanaka | ............. | H03H 9/643 333/196 |
| 8,358,177 B2 * | 1/2013 | Yamanaka | ........... | H03H 9/1071 333/196 |

(Continued)

FOREIGN PATENT DOCUMENTS

| | | |
|---|---|---|
| JP | 2008-252678 A | 10/2008 |
| WO | 03/003574 A1 | 1/2003 |

(Continued)

OTHER PUBLICATIONS

Official Communication issued in International Patent Application No. PCT/JP2020/027273, mailed on Sep. 24, 2020.

*Primary Examiner* — Andrea Lindgren Baltzell
*Assistant Examiner* — Alan Wong
(74) *Attorney, Agent, or Firm* — Keating & Bennett, LLP

(57) ABSTRACT

An acoustic wave filter includes a longitudinally coupled resonator including IDT electrodes and a reflector. A standard deviation of a pitch deviation rate of at least one of the reflector and the IDT electrodes is greater than or equal to about 1.4%.

20 Claims, 15 Drawing Sheets

(56) References Cited

U.S. PATENT DOCUMENTS

| | | | |
|---|---|---|---|
| 8,436,696 B2* | 5/2013 | Nakai | H03H 9/14535 |
| | | | 333/195 |
| 9,473,107 B2* | 10/2016 | Komatsu | H03H 9/54 |
| 2004/0108918 A1 | 6/2004 | Tsunekawa et al. | |
| 2008/0238576 A1 | 10/2008 | Takahashi et al. | |
| 2018/0102755 A1 | 4/2018 | Takamine | |
| 2019/0319601 A1 | 10/2019 | Takigawa | |

FOREIGN PATENT DOCUMENTS

| | | |
|---|---|---|
| WO | 2016/208236 A1 | 12/2016 |
| WO | 2018/123657 A1 | 7/2018 |

\* cited by examiner

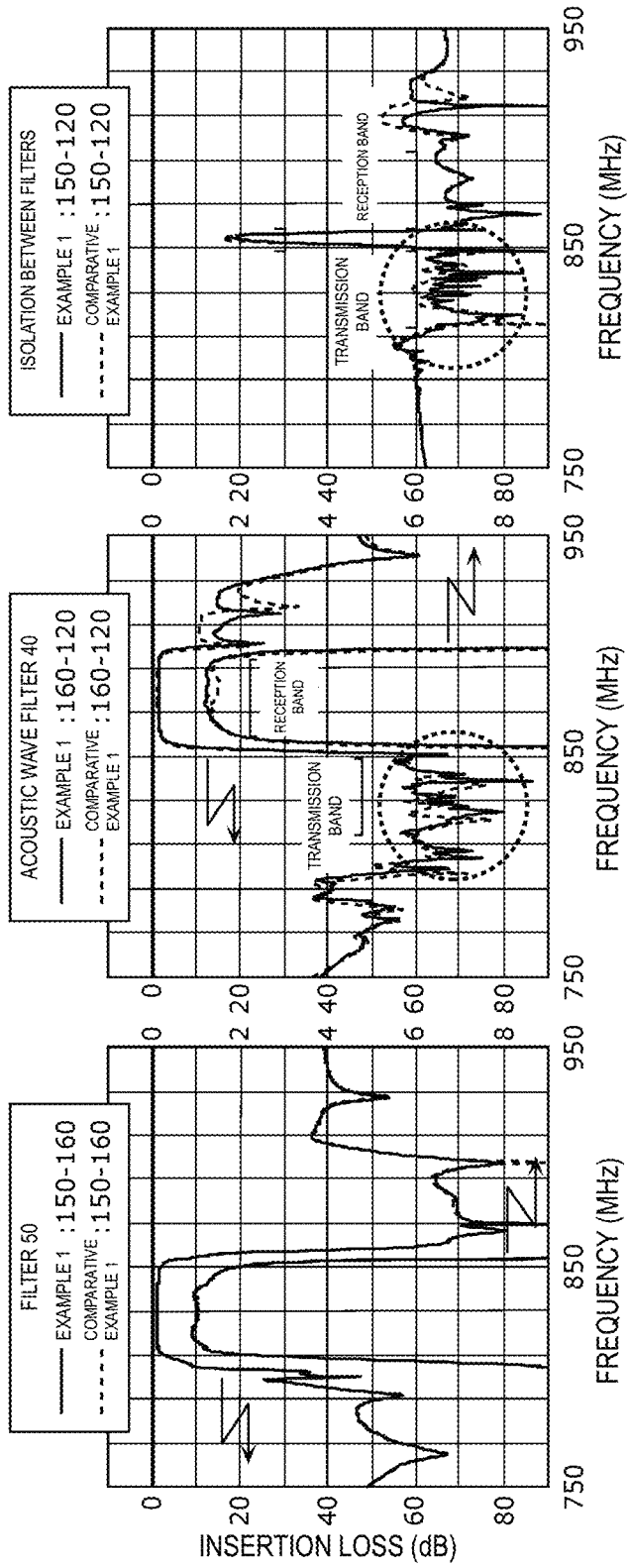

ACOUSTIC WAVE FILTER AND MULTIPLEXER

CROSS REFERENCE TO RELATED APPLICATIONS

This application claims the benefit of priority to Japanese Patent Application No. 2019-131525 filed on Jul. 17, 2019 and is a Continuation Application of PCT Application No. PCT/JP2020/027273 filed on Jul. 13, 2020. The entire contents of each application are hereby incorporated herein by reference.

BACKGROUND OF THE INVENTION

1. Field of the Invention

The present invention relates to an acoustic wave filter and a multiplexer including the acoustic wave filter.

2. Description of the Related Art

Acoustic wave filters disclosed in International Publication No. 2003/003574 each include a longitudinally coupled resonator in which interdigital transducer (IDT) electrodes and reflectors are arranged in the propagation direction of an acoustic wave. The IDT electrodes include their respective primary excitation regions. The primary excitation regions are adjacent to each other with a secondary excitation region therebetween, or each reflector and the corresponding primary excitation region are adjacent to each other with a secondary excitation therebetween. In each secondary excitation region, electrode fingers are arranged with a pitch that varies stepwise. International Publication No. 2003/003574 indicates that such an acoustic wave filter delivers low-loss performance.

There is a downside to such an acoustic wave filter including the longitudinally coupled resonator having secondary excitation regions in which electrode fingers are arranged with a pitch that varies with some regularity as disclosed in International Publication No. 2003/003574. For example, a spurious acoustic wave can be excited such that the acoustic wave filter can be deficient in terms of attenuation characteristics. The isolation characteristics of a multiplexer including the acoustic wave filter can thus degrade.

SUMMARY OF THE INVENTION

Preferred embodiments of the present invention provide acoustic wave filters each with improved attenuation characteristics and multiplexers each with improved isolation characteristics.

An acoustic wave filter according to a preferred embodiment of the present invention includes a longitudinally coupled resonator. The longitudinally coupled resonator includes a piezoelectric substrate, a plurality of interdigital transducer (IDT) electrodes, and a reflector. The plurality of IDT electrodes are on the piezoelectric substrate and side by side in a propagation direction of an acoustic wave. The reflector is adjacent to the plurality of IDT electrodes in the propagation direction of the acoustic wave. The plurality of IDT electrodes and the reflector each include a plurality of electrode fingers that extend in a direction crossing the propagation direction of the acoustic wave and that are parallel or substantially parallel. With a standard deviation of a pitch deviation rate being determined based on a histogram, the standard deviation of the deviation rate of at least one of the reflector and the plurality of IDT electrodes is greater than or equal to about 1.4%, wherein a k-th electrode finger pitch is a distance between a k-th electrode finger and a (k+1)th electrode finger in the propagation direction of the acoustic wave, k being an integer greater than or equal to 2, when a (k−1)th electrode finger, the k-th electrode finger, and the (k+1)th electrode finger are adjacent to each other, the pitch deviation rate of the k-th electrode finger is obtained by dividing a difference between the k-th electrode finger pitch and a per-section average electrode finger pitch by an overall average electrode finger pitch, the per-section average electrode finger pitch is an average of a (k−1)th electrode finger pitch and a (k+1)th electrode finger pitch, the overall average electrode finger pitch is an average pitch of all of the electrode fingers of the at least one of the reflector and the plurality of IDT electrodes including the three adjacent electrode fingers, the histogram illustrates variations in the pitch deviation rate and is obtained such that the pitch deviation rate of the k-th electrode finger is determined by calculation for every one of the electrode fingers of at least one of the reflector and the plurality of IDT electrodes including the three adjacent electrode fingers.

Preferred embodiments of the present invention provide acoustic wave filters that each have improved attenuation characteristics and multiplexers that each include such an acoustic wave filter and each have improved isolation characteristics.

The above and other elements, features, steps, characteristics and advantages of the present invention will become more apparent from the following detailed description of the preferred embodiments with reference to the attached drawings.

BRIEF DESCRIPTION OF THE DRAWINGS

FIGS. 8A to 8C include graphs for comparing the bandpass characteristics and the isolation characteristics of the multiplexer in Example 1 with those of a multiplexer in Comparative Example 1.

DETAILED DESCRIPTION OF THE PREFERRED EMBODIMENTS

Figure 1:
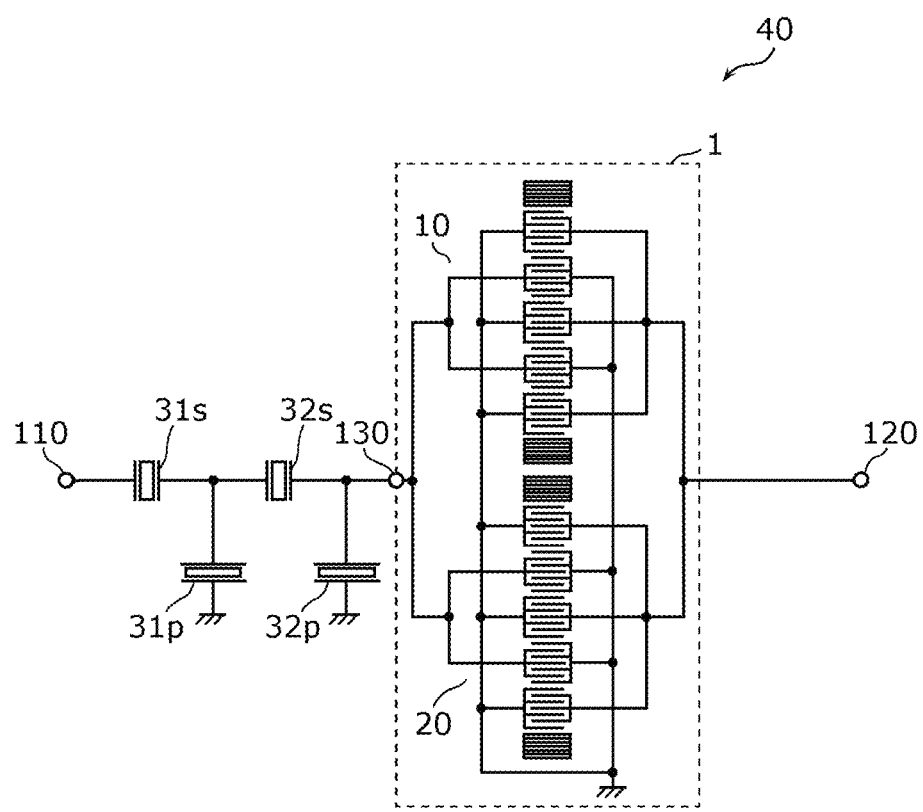
FIG. 1 is a circuit diagram of an acoustic wave filter according to a preferred embodiment of the present invention.

Hereinafter, preferred embodiments of the present invention will be described in detail with reference to the accompanying drawings. The following preferred embodiments are general or specific examples. Details such as values, shapes, materials, components, and arrangements and connection patterns of the components in the following preferred embodiments are provided merely as examples and should not be construed as limiting the present invention. Of the components in the following preferred embodiments, those not included in independent claims are described as optional components. The size and the relative size ratio of each component in the drawings is not necessarily accurate in a strict sense.

PREFERRED EMBODIMENT

Figure 2:
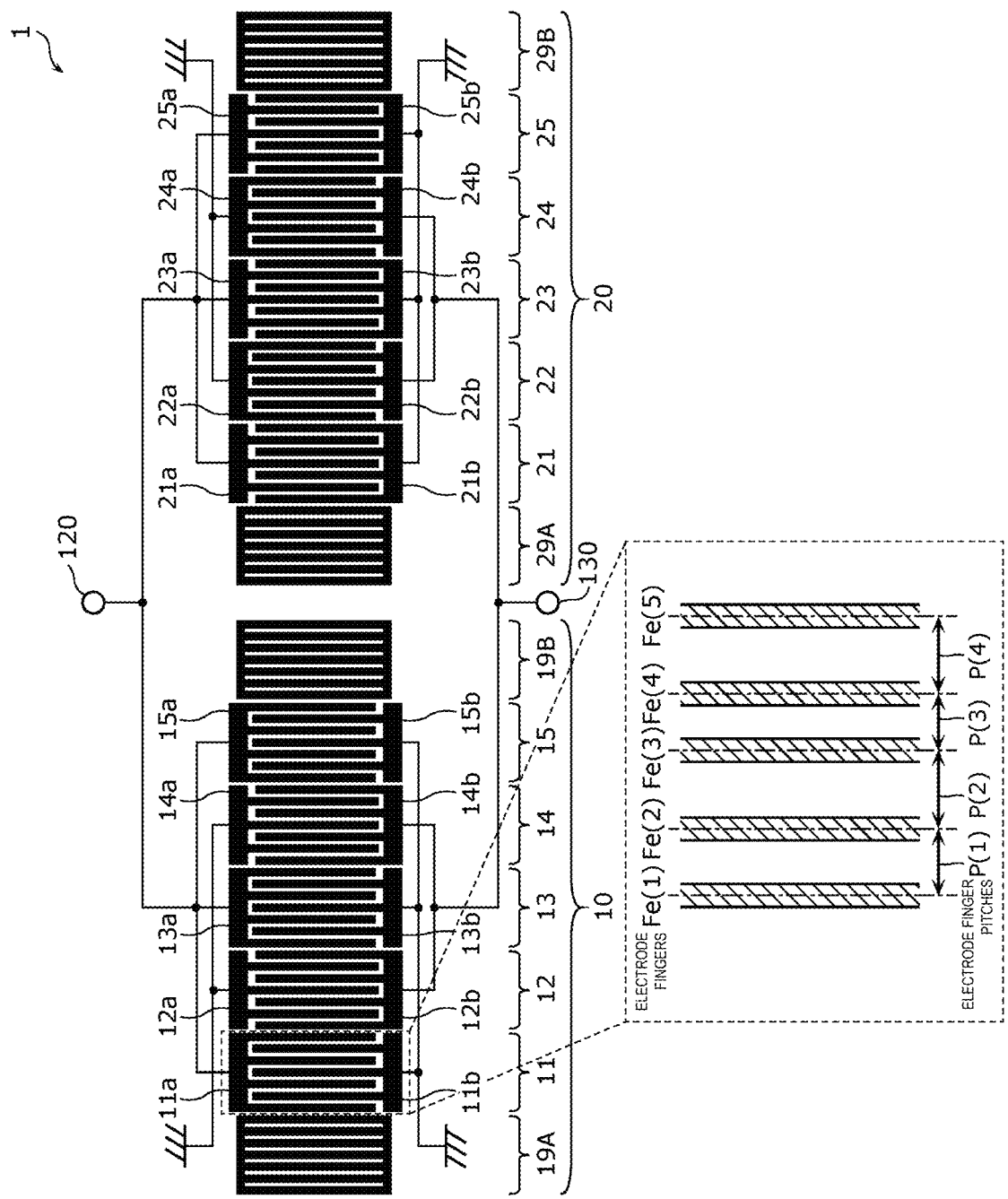
FIG. 2 is a schematic plan view of a longitudinally coupled resonator according to a preferred embodiment of the present invention, illustrating electrode layouts in the longitudinally coupled resonator.

1. Configuration of Acoustic Wave Filter 40 According to Preferred Embodiment FIG. 1 is a circuit configuration diagram of an acoustic wave filter 40 according to a preferred embodiment of the present invention. FIG. 2 is a schematic plan view of a longitudinally coupled resonator 1 according to a preferred embodiment of the present invention, illustrating electrode layouts in the longitudinally coupled resonator 1. More specifically, FIG. 2 illustrates the arrangement of IDT electrodes and reflectors included in the longitudinally coupled resonator 1 viewed in plan and also illustrates electrical connections between the IDT electrodes. The longitudinally coupled resonator 1 illustrated in FIG. 2 represents a typical arrangement of the IDT electrodes viewed in plan. Details such as the number and the length of electrode fingers of each IDT electrode and the electrode finger pitch may be changed.

As illustrated in FIG. 1, the acoustic wave filter 40 includes the longitudinally coupled resonator 1, a series-arm resonator 31s, a series-arm resonator 32s, a parallel-arm resonator 31p, a parallel-arm resonator 32p, an input/output terminal 110, and an input/output terminal 120.

The series-arm resonators 31s and 32s are, for example, acoustic wave resonators in series on a path that defines a connection between the input/output terminal 110 and the input/output terminal 120. The parallel-arm resonators 31p and 32p are, for example, acoustic wave resonators, each of which is connected between a corresponding node on the path and a ground.

As illustrated in FIG. 2, the longitudinally coupled resonator 1 includes a longitudinally coupled resonant portion 10 and a longitudinally coupled resonant portion 20, which are connected in parallel. The longitudinally coupled resonator 1 is disposed between a terminal 130 and the input/output terminal 120. The longitudinally coupled resonant portion 10 includes five interdigital transducer (IDT) electrodes, a reflector 19A, and a reflector 19B. The IDT electrodes are arranged side by side on a piezoelectric substrate in the propagation direction of an acoustic wave and are denoted by 11, 12, 13, 14, and 15, respectively. The reflectors 19A and 19B are adjacent to the five IDT electrodes in the propagation direction of the acoustic wave. The longitudinally coupled resonant portion 20 includes five interdigital transducer (IDT) electrodes, a reflector 29A, and a reflector 29B. The IDT electrodes are arranged side by side on the piezoelectric substrate in the propagation direction of the acoustic wave and are denoted by 21, 22, 23, 24, and 25, respectively. The reflectors 29A and 29B are adjacent to the five IDT electrodes in the propagation direction of the acoustic wave.

The IDT electrodes 11 to 15, the IDT electrodes 21 to 25, and the reflectors 19A, 19B, 29A, and 29B are provided on the piezoelectric substrate. The IDT electrodes 11 to 15, the IDT electrodes 21 to 25, and the piezoelectric substrate define a surface acoustic wave resonator.

The IDT electrodes 11 to 15, the IDT electrodes 21 to 25, and the reflectors 19A, 19B, 29A, and 29B each include electrode fingers that extend in a direction crossing the propagation direction of the acoustic wave and are in parallel or substantially in parallel.

The IDT electrode 11 includes a comb-shaped electrode 11a and a comb-shaped electrode 11b. The comb-shaped electrode 11a is an example of a first comb-shaped electrode. The comb-shaped electrode 11a includes some of the electrode fingers of the IDT electrode 11. The comb-shaped electrode 11a also includes a busbar electrode that provides a connection between first ends of the electrode fingers. The comb-shaped electrode 11a is connected to the input/output terminal 120. The comb-shaped electrode 11b is an example of a second comb-shaped electrode. The comb-shaped electrode 11b includes other electrode fingers of the IDT electrode 11. The comb-shaped electrode 11b also includes a busbar electrode that provides a connection between second ends of the electrode fingers. The comb-shaped electrode 11b is connected to the ground. The electrode fingers of the comb-shaped electrode 11a interdigitate with the electrode fingers of the comb-shaped electrode 11b. The IDT electrode 13 includes a comb-shaped electrode 13a (first comb-shaped electrode) and a comb-shaped electrode 13b (second comb-shaped electrode). The comb-shaped electrode 13a is connected to the input/output terminal 120, and the comb-shaped electrode 13b is connected to the ground. The IDT electrode 15 includes a comb-shaped electrode 15a (first comb-shaped electrode) and a comb-shaped electrode 15b (second comb-shaped electrode). The comb-shaped electrode 15a is connected to the input/output terminal 120, and the comb-shaped electrode 15b is connected to the ground. The IDT electrode 21 includes a comb-shaped electrode 21a (first comb-shaped electrode) and a comb-shaped electrode 21b (second comb-shaped electrode). The comb-shaped electrode 21a is connected to the input/output terminal 120, and the comb-shaped electrode 21b is connected to the ground. The IDT electrode 23 includes a comb-shaped electrode 23a (first comb-shaped electrode) and a comb-shaped electrode 23b (second comb-shaped electrode). The comb-shaped electrode 23a is connected to the input/output terminal 120, and the comb-shaped electrode 23b is connected to the ground. The IDT electrode 25 includes a comb-shaped electrode 25a (first comb-shaped electrode) and a comb-shaped electrode 25b (second comb-shaped electrode). The comb-shaped electrode 25a is connected to the input/output terminal 120, and the comb-shaped electrode 25b is connected to the ground.

The IDT electrode 12 includes a comb-shaped electrode 12a and a comb-shaped electrode 12b. The comb-shaped electrode 12b is an example of the first comb-shaped electrode. The comb-shaped electrode 12b includes some of the electrode fingers of the IDT electrode 12. The comb-shaped electrode 12b also includes a busbar electrode that provides a connection between first ends of the electrode fingers. The comb-shaped electrode 12b is connected to the terminal 130. The comb-shaped electrode 12a is an example of a second comb-shaped electrode. The comb-shaped electrode 12a includes the other electrode fingers of the IDT electrode 12. The comb-shaped electrode 12a also includes a busbar electrode that provides a connection between second ends of the electrode fingers. The comb-shaped electrode 12a is connected to the ground. The electrode fingers of the comb-shaped electrode 12a interdigitate with the electrode fingers of the comb-shaped electrode 12b. The IDT electrode 14 includes a comb-shaped electrode 14a (first comb-shaped electrode) and a comb-shaped electrode 14b (second comb-shaped electrode). The comb-shaped electrode 14b is connected to the terminal 130, and the comb-shaped electrode 14a is connected to the ground. The IDT electrode 22 includes a comb-shaped electrode 22b (first comb-shaped electrode) and a comb-shaped electrode 22a (second comb-shaped electrode). The comb-shaped electrode 22b is connected to the terminal 130, and the comb-shaped electrode 22a is connected to the ground. The IDT electrode includes a comb-shaped electrode 24b (first comb-shaped electrode) and a comb-shaped electrode 24a (second comb-shaped electrode). The comb-shaped electrode 24b is connected to the terminal 130, and the comb-shaped electrode 24a is connected to the ground.

At least two IDT electrodes are included in each of the longitudinally coupled resonant portion 10 and the longitudinally coupled resonant portion 20. At least one reflector is included in each of the longitudinally coupled resonant portion 10 and the longitudinally coupled resonant portion 20.

The number of longitudinally coupled resonant portions included in the longitudinally coupled resonator 1 of the acoustic wave filter 40 according to the present preferred embodiment is not limited. In some preferred embodiments, the longitudinally coupled resonator 1 may include the longitudinally coupled resonant portion 10 only or the longitudinally coupled resonant portion 20 only.

The number of series-arm resonators included in the acoustic wave filter 40 according to the present preferred embodiment is not limited. Similarly, the number of parallel-arm resonators included in the acoustic wave filter 40 according to the present preferred embodiment is not limited. The series-arm resonators 31s and 32s and the parallel-arm resonators 31p and 32p may be optionally included.

In the acoustic wave filter 40 according to the present preferred embodiment, the paths that provide connections between the acoustic wave resonators, the input/output terminals, and the ground, which are illustrated in FIG. 1, may include, for example, other circuit elements and wiring disposed thereon.

2. Electrode Finger Pitch and Pitch Deviation Rate

As illustrated in FIG. 2, the IDT electrodes 11 to 15, the IDT electrodes 21 to 25, and the reflectors 19A, 19B, 29A, and 29B each include electrode fingers Fe, which extend in the direction crossing the propagation direction of the acoustic wave and are in parallel or substantially in parallel.

The variations in the electrode finger pitch P are what distinguish the acoustic wave filter 40 according to the present preferred embodiment. The electrode finger pitch P is the distance between adjacent ones of the electrode fingers Fe (the distance between the center lines of the electrode fingers Fe in the propagation direction of the acoustic wave). The first electrode finger and the second electrode finger in the propagation direction of the acoustic wave of each IDT electrode or each reflector are denoted by Fe(1) and Fe(2), respectively. Regarding the IDT electrode 11 illustrated in FIG. 2, for example, P(1) denotes the electrode finger pitch of the electrode finger Fe(1) or, more specifically, the distance between the electrode finger Fe(1) and the electrode finger Fe(2) (the distance between the center line of the electrode finger Fe(1) in the propagation direction of the acoustic wave and the center line of the electrode finger Fe(2) in the propagation direction of the acoustic wave). The same applies for P(2), P(3), and P(4), which denote the electrode finger pitch of the electrode finger Fe(2), the electrode finger pitch of an electrode finger Fe(3), and the electrode finger pitch of an electrode finger Fe(4), respectively. That is, the k-th electrode finger in the propagation direction of the acoustic wave is denoted by Fe(k) and includes an electrode finger pitch P(k), k being a natural number. The electrode finger pitch P(k) is the distance between the electrode finger Fe(k) and the electrode finger Fe(k+1) (the distance between the center line of the electrode finger Fe(k) in the propagation direction of the acoustic wave and the center line of the electrode finger Fe(k+1) in the propagation direction of the acoustic wave).

Figure 3:
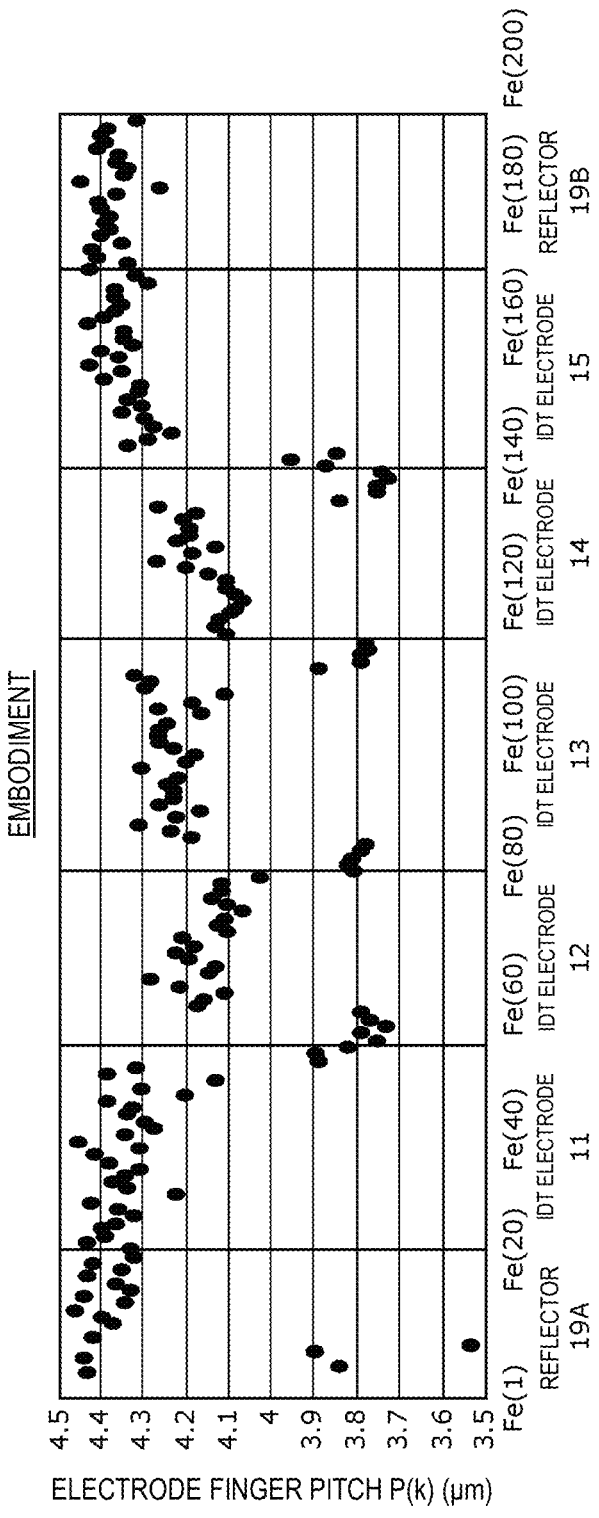
FIG. 3 is a graph illustrating variations in the electrode finger pitch in a longitudinally coupled resonator according to a preferred embodiment of the present invention.

FIG. 3 is a graph illustrating variations in the electrode finger pitch P(k) in the longitudinally coupled resonator 1 according to the present preferred embodiment. P(k) in FIG. 3 denotes the electrode finger pitch in the longitudinally coupled resonant portion 10 included in the longitudinally coupled resonator 1. The horizontal axis of the graph represents the position of each of the electrode fingers Fe(1) to Fe(200) included in the longitudinally coupled resonant portion 10, and the vertical axis of the graph represents the electrode finger pitch P(k) of the electrode finger Fe(k).

As shown in FIG. 3, the longitudinally coupled resonant portion 10 according to the present preferred embodiment includes electrode finger sections in which the electrode finger pitch P(k) varies irregularly.

Figure 4:
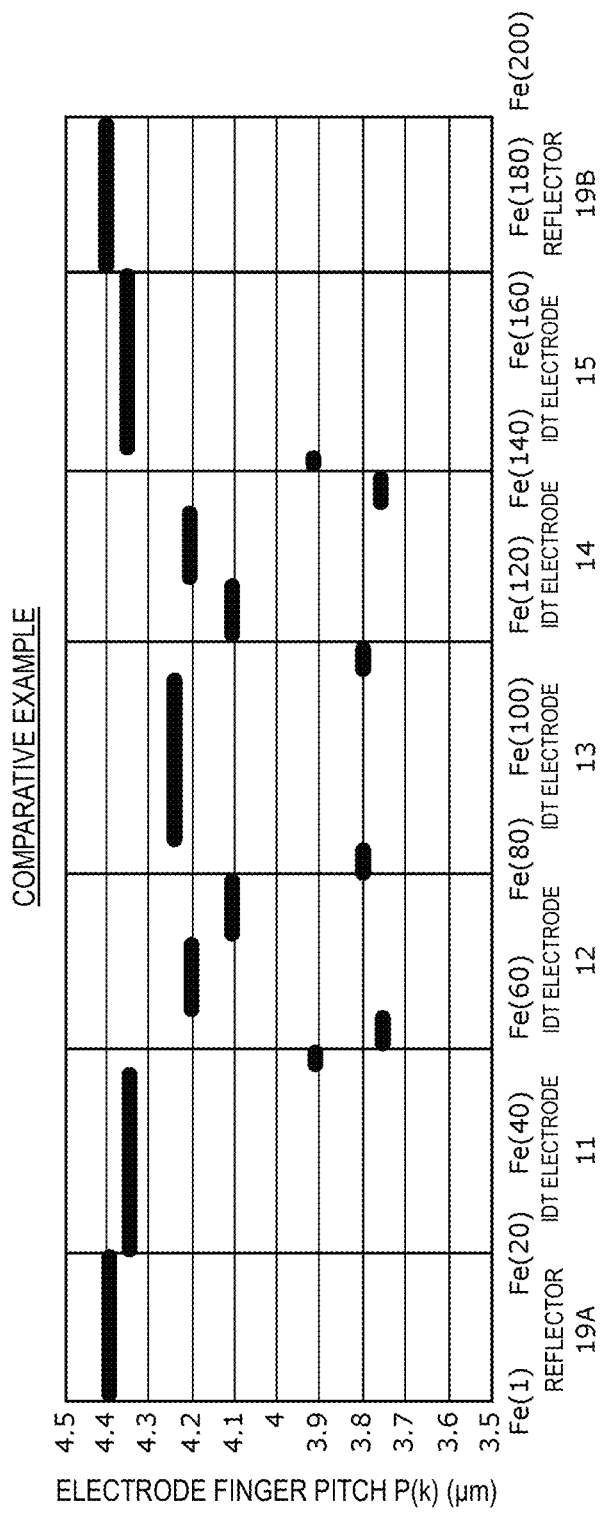
FIG. 4 is a graph illustrating variations in the electrode finger pitch in a longitudinally coupled resonator in a comparative example.

FIG. 4 is a graph illustrating variations in the electrode finger pitch P(k) in a longitudinally coupled resonant portion of an acoustic wave filter in a comparative example. As with the acoustic wave filter 40 according to the present preferred embodiment, the acoustic wave filter in the comparative example includes an acoustic wave resonator in which two acoustic wave resonant portions are arranged in parallel or substantially in parallel. The difference between the present preferred embodiment and the comparative example is in variations in the electrode finger pitch P(k) in each of the two acoustic wave resonant portions. P(k) FIG. 4 denotes the electrode finger pitch in a longitudinally coupled resonant portion in the comparative example.

As shown in FIG. 4, the electrode finger pitch P(k) in the longitudinally coupled resonant portion in the comparative example varies regularly. More specifically, the IDT electrodes and the reflector of the longitudinally coupled resonant portion in the comparative example each include one or more sections in which three or more adjacent electrode fingers Fe have the same or substantially the same electrode finger pitch P. Examples in which the electrode finger pitch P(k) varies with some regularity is not limited to the one illustrated in FIG. 4. One of the examples is a gradation pitch in which the electrode finger pitch P(k) increases or decreases at a constant rate along the axis representing the individual electrode fingers Fe, that is, the inclination of the line representing the electrode finger pitch P(k) is constant.

In each of the IDT electrodes and the reflectors of the longitudinally coupled resonant portion 10 according to the present preferred embodiment, three or more adjacent electrode fingers Fe do not have the same or substantially the same electrode finger pitch P and the inclination of the line representing the electrode finger pitch P(k) of three or more adjacent electrode fingers Fe is not constant.

With regard to the longitudinally coupled resonator included in the acoustic wave filter, it is not required that variations in the electrode finger pitch P(k) are irregular in all of the IDT electrodes 11 to 15 and the reflectors 19A and 19B of the longitudinally coupled resonant portion 10 according to the present preferred embodiment as illustrated in FIG. 3. Only at least one of the IDT electrodes 11 to 15 or at least one of the reflectors 19A and 19B in the acoustic wave filter according to the present preferred embodiment needs to include a section in which three or more adjacent electrode fingers Fe are arranged such that the electrode finger pitch P(k) varies irregularly.

As with the electrode finger pitch P(k) in the longitudinally coupled resonant portion 10, the electrode finger pitch P(k) in the longitudinally coupled resonant portion 20 of the longitudinally coupled resonator 1 may vary irregularly. The electrode finger pitch P(k) in the longitudinally coupled resonant portion 10 and the electrode finger pitch P(k) in the longitudinally coupled resonant portion 20 may vary in the same pattern or in different patterns.

Figure 5:
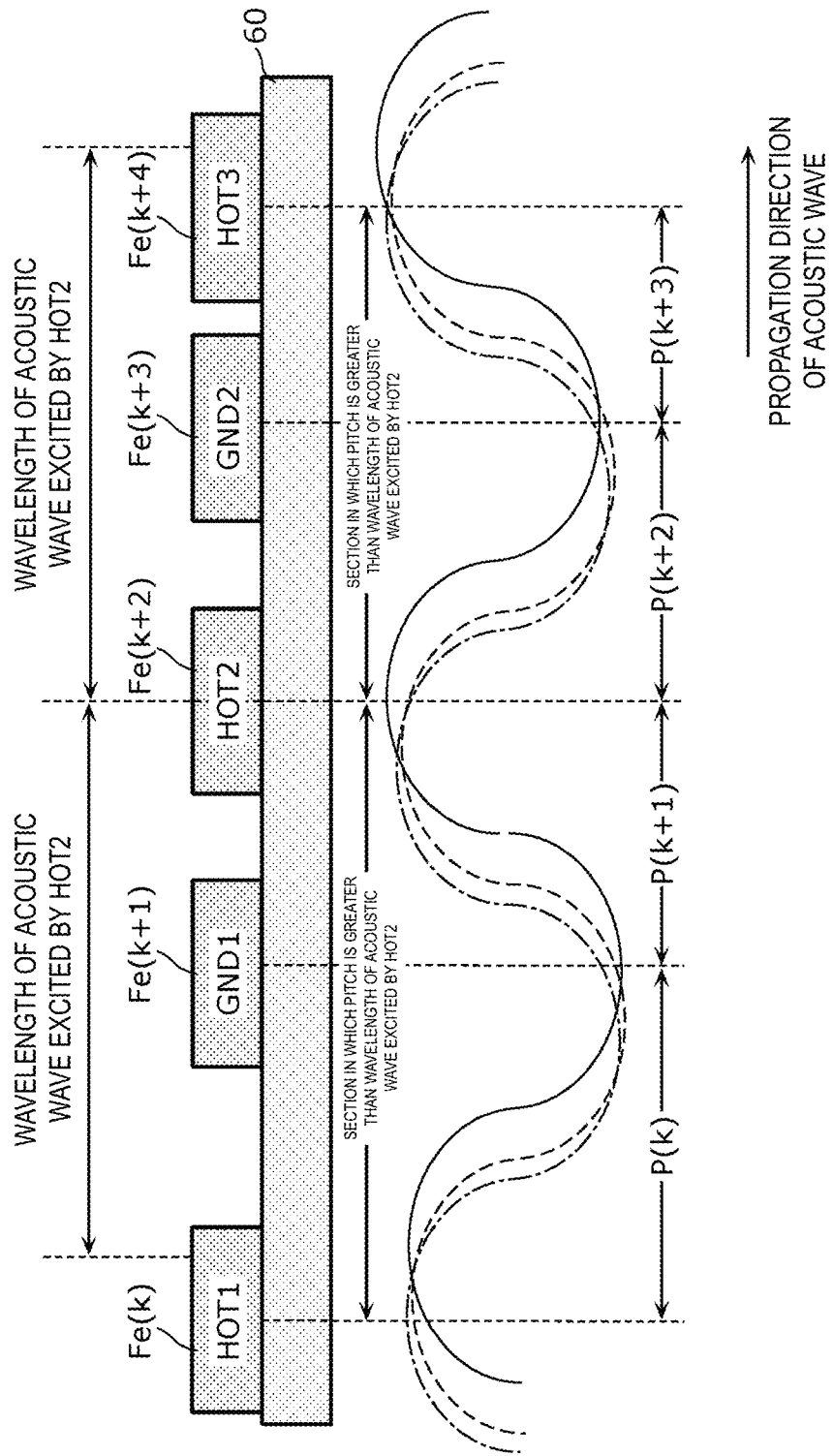
FIG. 5 illustrates features associated with irregular variations in the electrode finger pitch in a longitudinally coupled resonator according to a preferred embodiment of the present invention.

FIG. 5 illustrates features associated with irregular variations in the electrode finger pitch P (k) in the longitudinally coupled resonator 1 according to the present preferred embodiment. FIG. 5 is a schematic sectional view of a piezoelectric substrate 60 and the electrode fingers Fe(k) to Fe(k+4) on the substrate 60. The electrode fingers Fe(k) to Fe(k+4) illustrated in FIG. 5 have the respective electrode finger pitches, which are denoted by P(k) to P(k+4). That is, variations in the electrode finger pitch are irregular.

The electrode fingers Fe(k) to Fe(k+4) illustrated in FIG. 5 are provided in the same IDT electrode. The electrode fingers Fe(k), Fe(k+2), and Fe(k+4) define a first comb-shaped electrode supplied with signal potential (HOT). The electrode fingers Fe(k+1) and Fe(k+3) define a second comb-shaped electrode connected to the ground (GND). As denoted by P(k), P(k+1), P(k+2), and P(k+3), variations in the electrode finger pitch are irregular.

With the electrode fingers Fe(k) and Fe(k+2) being HOT electrodes, an acoustic wave excited by the electrode finger Fe(k+2) and denoted by a solid line in FIG. 5 is out of phase with an acoustic wave excited by the electrode finger Fe(k) and denoted by a dash-dot line in FIG. 5. That is, the wavelength of the acoustic wave excited by HOT2 does not coincide with the wavelength of the acoustic wave excited by electrode finger Fe(k). With the electrode fingers (k+2) and Fe(k+4) being HOT electrodes, the acoustic wave excited by the electrode finger Fe(k+2) and denoted by the solid line in FIG. 5 is out of phase with an acoustic wave excited by the electrode finger Fe(k+4) and denoted by a broken line in FIG. 5. That is, the wavelength of the acoustic wave excited by HOT2 does not coincide with the wavelength of the acoustic wave excited by electrode finger Fe(k+4). This is likely to result in an acoustic impedance mismatch between the HOT electrodes (the electrode fingers Fe(k), Fe(k+2), and Fe(k+4)).

The electrode fingers Fe(k) to Fe(k+3) illustrated in FIG. 5 are included in the IDT electrode on the input side of the longitudinally coupled resonator 1, and the electrode finger Fe(k+4) illustrated in FIG. 5 is included in the IDT electrode on the output side of the longitudinally coupled resonator 1. The electrode fingers Fe(k), Fe(k+2), and Fe(k+4) define a first comb-shaped electrode supplied with signal potential (HOT). The electrode fingers Fe(k+1) and Fe(k+3) define a second comb-shaped electrode connected to the ground (GND). As denoted by P(k), P(k+1), P(k+2), and P(k+3), variations in the electrode finger pitch are irregular.

With the electrode fingers Fe(k) and Fe(k+2) being included in the IDT electrode on the input side, an acoustic wave excited by the electrode finger Fe(k) is out of phase with an acoustic wave excited by the electrode finger Fe(k+2) such that the acoustic waves excited respectively by the electrode fingers Fe(k) and Fe(k+2) cannot be picked up in an efficient manner by the electrode finger Fe(k+4) included in the IDT electrode on the output side.

As an approach to improving the attenuation characteristics of the longitudinally coupled resonator, excitation of signals of frequencies in the attenuation band by the electrode finger acting as HOT electrodes may be reduced or prevented, and the signals of frequencies in the attenuation band may be reduced or prevented from propagating from the IDT electrode on the input side to the IDT electrode on the output side.

As for conventional longitudinally coupled resonators with gradation pitch, where the electrode finger pitch P(k) increases or decreases at a constant rate along the axis representing the individual electrode fingers Fe, the phase difference may be cancelled to reduce or prevent signals of frequencies in the attenuation band from propagating from the IDT electrode on the input side to the IDT electrode on the output side. However, electrode fingers acting as HOT are deficient in the ability to reduce or prevent excitation of signals of frequencies in the attenuation band such that such a conventional longitudinally coupled resonator fails to provide sufficient improvement in attenuation.

A solution to this problem is the acoustic wave filter according to the present preferred embodiment in which the electrode finger pitch P in at least one IDT electrode or at least one reflector corresponds to the frequencies in the attenuation band and varies irregularly as illustrated in FIG. 5. The acoustic wave filter 40 according to the present preferred embodiment is able to reduce or prevent excitation of spurious acoustic waves, and enable acoustic waves under excitation to escape being picked up. The attenuation characteristics of the acoustic wave filter 40 may be improved accordingly.

The following describes a pitch deviation rate D and a standard deviation SD of the pitch deviation rate D, which are defined as follows in relation to the acoustic wave filter 40 according to the present preferred embodiment.

Figure 6A:
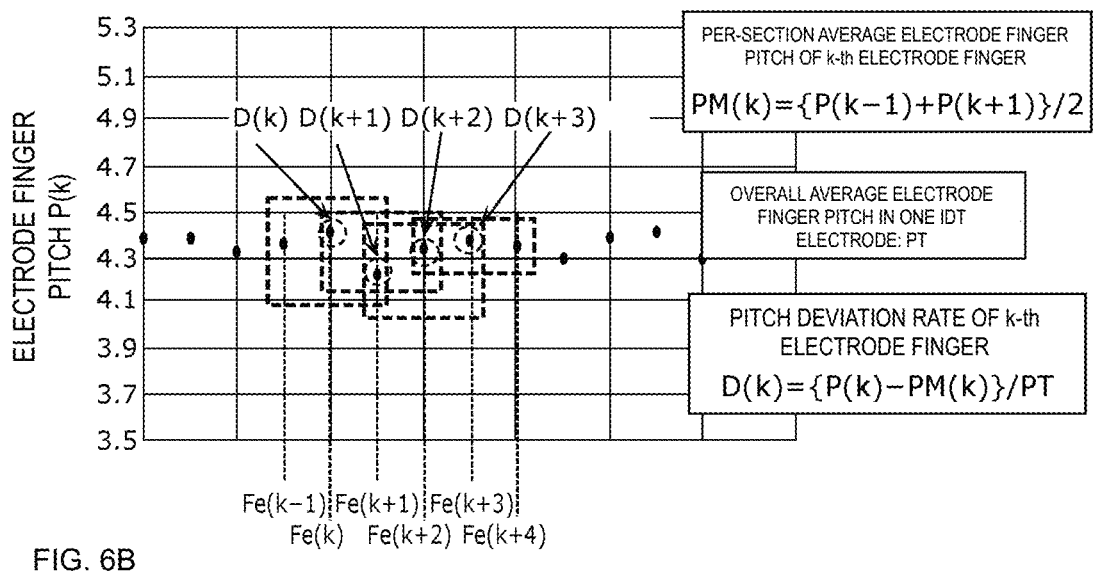
FIGS. 6A to 6C illustrate the pitch deviation rate and the standard deviation of the pitch deviation rate in relation to irregular variations in the electrode finger pitch in a longitudinally coupled resonator according to a preferred embodiment of the present invention.
Figure 6B:
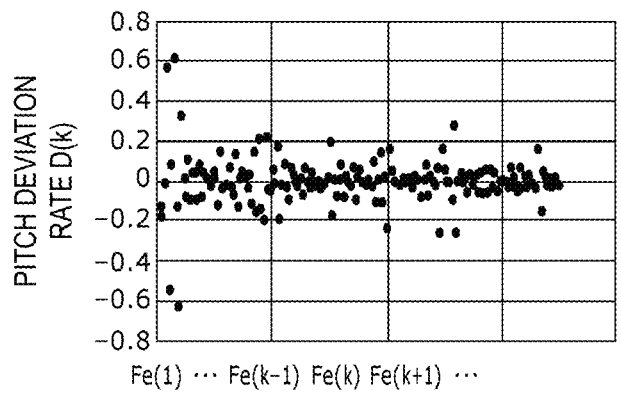
Figure 6C:
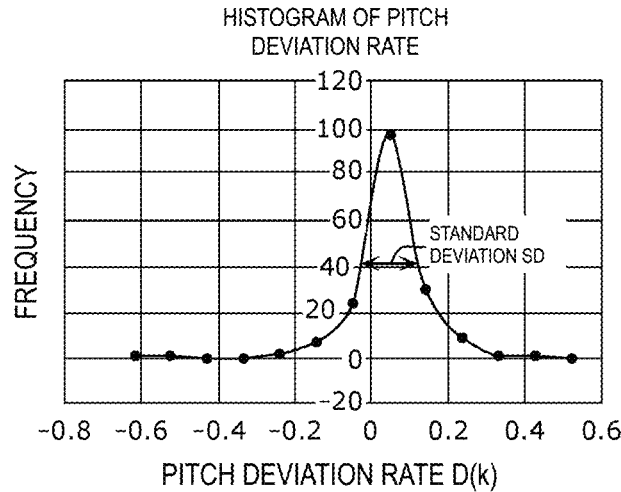

FIGS. 6A to 6C illustrate the pitch deviation rate D and the standard deviation SD of the pitch deviation rate D in relation to irregular variations in the electrode finger pitch in the longitudinally coupled resonator 1 according to the present preferred embodiment.

FIG. 6A illustrates, as an example, variations in the electrode finger pitch P(k) in the IDT electrode or the reflector included in the longitudinally coupled resonator. The horizontal axis of the graph represents the position of the electrode finger Fe(k) included in the IDT electrode or the reflector, and the vertical axis of the graph represents the electrode finger pitch P (k) of the electrode finger Fe(k).

As described above, the electrode finger pitch P(k) is the distance between the k-th electrode finger Fe(k) and the (k+1)th electrode finger Fe(k+1) in the propagation direction of the acoustic wave (the distance between the center line of the electrode finger Fe(k) in the propagation direction of the acoustic wave and the center line of the electrode finger Fe(k+1) in the propagation direction of the acoustic wave), k being an integer greater than or equal to 2.

PM(k) denotes a per-section average electrode finger pitch. When the electrode fingers Fe(k−1), Fe(k), and Fe(k+1) are adjacent to each other, the per-section average electrode finger pitch is the average of the electrode finger pitch P(k−1) and the electrode finger pitch P(k+1) and is thus expressed as PM(k)={P(k−1)+P(k+1)}/2. D(k) denotes the pitch deviation rate of the electrode finger Fe(k) and is obtained by dividing P(k)−PM(k) by PT, where P(k)−PM(k) is the difference between the electrode finger pitch P(k) and the per-section average electrode finger pitch PM(k), and PT is an overall average electrode finger pitch or, more specifically, an average pitch of all of the electrode fingers of the IDT electrode or the reflector including the electrode fingers Fe(k−1), Fe(k), and Fe(k+1). D (k) is thus expressed as D(k)={P(k)−PM(k)}/PT.

A histogram of the pitch deviation rate D(k) of the IDT electrode or the reflector including the electrode fingers Fe(k−1), Fe(k), and Fe(k+1) is then obtained such that the pitch deviation rate D(k) of the electrode finger Fe(k) is determined by calculation for every one of the electrode fingers Fe of the IDT electrode or of the reflector included in the longitudinally coupled resonator.

FIG. 6B illustrates, as an example, variations in the pitch deviation rate D(k) of the IDT electrode or the reflector included in the longitudinally coupled resonator. The horizontal axis of the graph represents the position of the electrode finger Fe(k) included in the IDT electrode or the reflector, and the vertical axis of the graph represents the pitch deviation rate D(k).

FIG. 6C is an example of the histogram of the pitch deviation rate D(k) of the IDT electrode or the reflector included in the longitudinally coupled resonator.

Finally, the histogram of the pitch deviation rate D(k) is used to determine, by calculation, the standard deviation SD of the pitch deviation rate D(k) of the IDT electrode or the reflector included in the longitudinally coupled resonator.

According to the definitions described above, the standard deviation SD of the pitch deviation rate D(k) decreases with increasing regularity of variations in the electrode finger pitch P(k). That is, the standard deviation SD of the pitch deviation rate D(k) increases with increasing irregularity of variations in the electrode finger pitch P(k).

The standard deviation of the pitch deviation rate D(k) of each of the IDT electrodes 11 to 15 and the reflectors 19A and 19B included in the longitudinally coupled resonant portion 10 of the longitudinally coupled resonator 1 of the acoustic wave filter 40 according to the present preferred embodiment is greater than or equal to about 1.4%, for example. The same applies to the longitudinally coupled resonant portion 20. That is, according to the histogram, the standard deviation of the pitch deviation rate D(k) of each of the IDT electrodes 21 to 25 and the reflectors 29A and 29B included in the longitudinally coupled resonant portion 20 is greater than or equal to about 1.4%, for example.

Thus, an acoustic impedance mismatch is likely to occur while acoustic waves of frequencies in the attenuation band of the acoustic wave filter propagate on the substrate. The reason for this is that, for example, an acoustic wave excited by the electrode finger Fe(k) tends to be out of phase with an acoustic wave excited by the electrode finger Fe(k+2). In this state, excitation of the acoustic waves of frequencies in the attenuation band of the acoustic wave filter may be reduced or prevented. With the electrode fingers Fe(k) and Fe(k+2) being included in an IDT electrode on the input side, the acoustic wave excited by the electrode finger Fe(k) is out of phase with the acoustic wave excited by the electrode finger Fe(k+2), and for this reason, these acoustic waves cannot be picked up by an IDT electrode on the output side in an efficient manner. The attenuation characteristics of the acoustic wave filter 40 may be improved accordingly.

As for the comparative example illustrated in FIG. 4, variations in the electrode finger pitch P(k) in each of the IDT electrodes and the reflectors included in the longitudinally coupled resonant portion are more regular such that the standard deviation SD determined based on the histogram is less than about 1.4%. The same applies to the IDT electrodes and the reflectors with gradation pitch. More specifically, when the electrode finger pitch P(k) increases or decreases at a constant rate along the axis representing the individual electrode fingers Fe, that is, when the inclination of the line representing the electrode finger pitch P(k) is constant, variations in the electrode finger pitch P(k) are more regular such that the standard deviation SD determined on the basis of the histogram is less than about 1.4%.

As for the longitudinally coupled resonator 1 according to the present preferred embodiment, the standard deviation SD determined based on the histogram is greater than or equal to about 1.4%, for example. This is preferable for at least one of the IDT electrodes 11 to 15 or at least one of the reflectors 19A and 19B included in the longitudinally coupled resonant portion 10 or at least one of the IDT electrodes 21 to 25 or at least one of the reflectors 29A and 29B included in the longitudinally coupled resonant portion 20.

For example, an IDT electrode more pertinent than the other IDT electrodes to the attenuation characteristics or a reflector more pertinent to the other reflector to the attenuation characteristics may be subject to the requirement that the standard deviation SD determined based on the histogram is greater than or equal to about 1.4%. In this way, the attenuation characteristics of the acoustic wave filter 40 may be more effectively improved.

Alternatively, the longitudinally coupled resonator 1 according to the present preferred embodiment may be configured such that at least one of the IDT electrodes 11 to 15 included in the longitudinally coupled resonant portion 10 or at least one of the IDT electrodes 21 to 25 included in the longitudinally coupled resonant portion 20 is subject to the requirement that the standard deviation SD determined based on the histogram is greater than or equal to about 1.4%, for example. As for the reflectors 19A, 19B, 29A, and 29B, the standard deviation SD determined based on the histogram may be less than about 1.4%.

That is, the electrode finger pitch P(k) in an IDT electrode more pertinent than the other IDT electrodes to the attenuation characteristics varies irregularly. This is conductive to an improvement in the attenuation characteristics of the acoustic wave filter 40. Meanwhile, the reflectors may be produced in such a manner as to reduce or minimize variations in the electrode finger pitch P(k). This provides stability of attenuation poles outside the attenuation band specified in accordance with the resonance action of the reflectors.

Alternatively, the longitudinally coupled resonator 1 according to the present preferred embodiment may be configured in such a manner that one of the IDT electrodes 11 to 15 or one of the IDT electrodes 21 to 25 is subject to the requirement that the standard deviation SD determined on the basis of the histogram be greater than or equal to about 1.4%, for example. As for the other IDT electrodes, the standard deviation SD determined on the basis of the histogram may be less than about 1.4%.

That is, an IDT electrode more pertinent than the other IDT electrodes to the attenuation characteristics is custom engineered for an improvement in the attenuation characteristics of the acoustic wave filter 40. Meanwhile, the other IDT electrodes may be provided so as to reduce or minimize electrode-to-electrode variations, thus eliminating or reducing the possibility that the characteristics will deteriorate.

Alternatively, the longitudinally coupled resonator 1 according to the present preferred embodiment may be configured such that at least one of the reflectors 19A and 19B included in the longitudinally coupled resonant portion 10 or at least one of the reflectors 29A and 29B included in the longitudinally coupled resonant portion 20 is subject to the requirement that the standard deviation SD determined based on the histogram be greater than or equal to about 1.4%, for example. As for the IDT electrodes 11 to 15 and the IDT electrodes 21 to 25, the standard deviation SD determined based on the histogram may be less than about 1.4%.

That is, the electrode finger pitch P(k) of a reflector more pertinent than the other reflectors to the attenuation characteristics varies irregularly. This provides an improvement in the attenuation characteristics of the acoustic wave filter 40. Meanwhile, the IDT electrodes may be provided so as to reduce or minimize variations in the electrode finger pitch P(k). This provides stability of the insertion loss in the passband.

3. Configuration and Characteristics of Multiplexer 100 in Example 1

Figure 7:
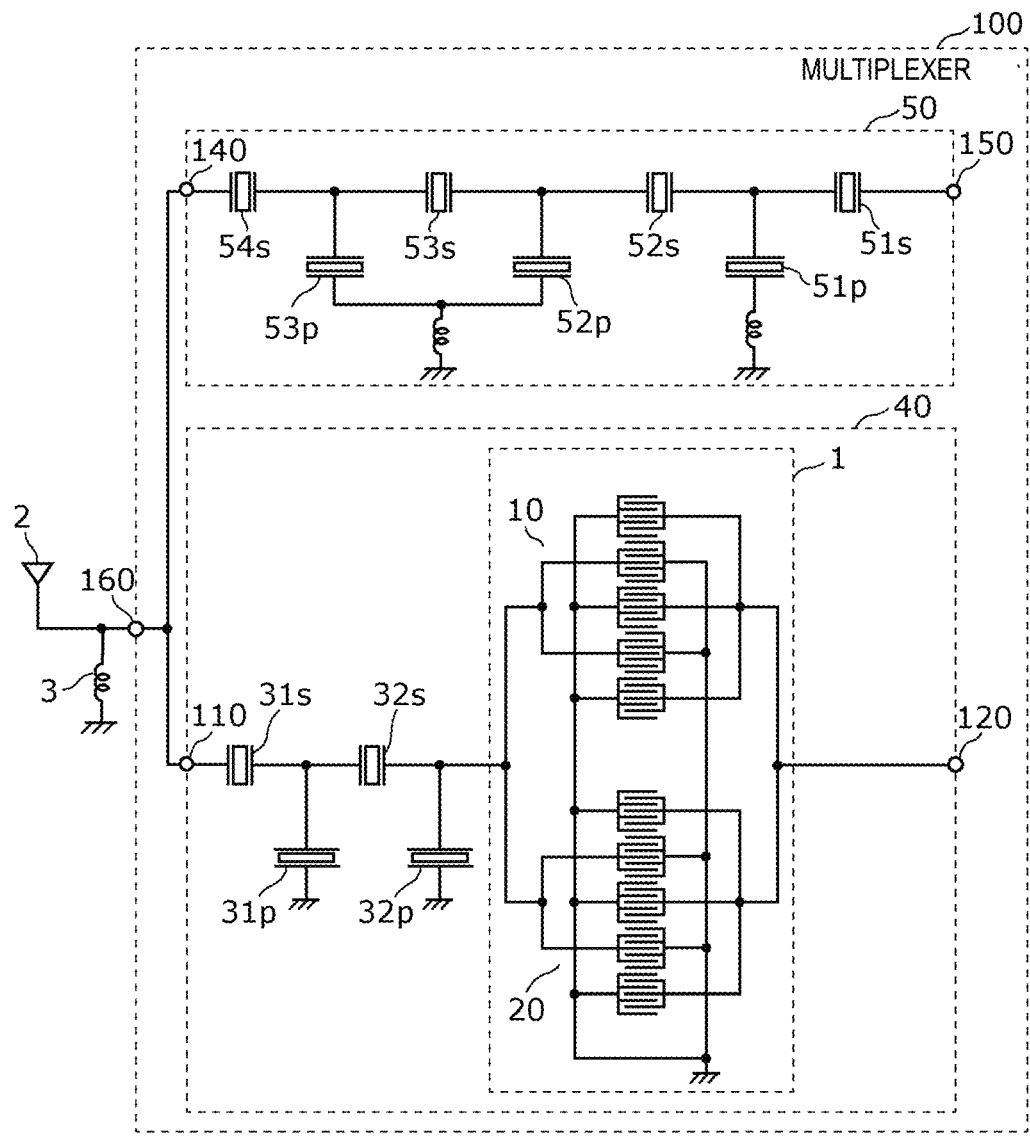
FIG. 7 is a configuration diagram illustrating a multiplexer and peripheral circuitry in Example 1 of a preferred embodiment of the present invention.

FIG. 7 is a configuration diagram illustrating a multiplexer 100 and peripheral circuitry in Example 1 of a preferred embodiment of the present invention. As illustrated in FIG. 7, the multiplexer 100 includes the acoustic wave filter 40, a filter 50, and a common terminal 160. The multiplexer 100 is connected to the common terminal 160 to connect to an antenna 2. An inductor 3 is connected between the ground and a path that provides a connection between the common terminal 160 and the antenna 2. The inductor 3 is an impedance matching inductor. The inductor 3 may be connected in series with and between the common terminal 160 and the antenna 2. The inductor 3 may be included in the multiplexer 100 or may be externally added to the multiplexer 100. The inductor 3 may be, for example, a capacitor or may be a circuit that is a combination of an inductor and a capacitor.

The filter 50 is an example of a first filter and is included as a transmitting filter for long term evolution (LTE) Band 26 (for example, transmission band: about 824 MHz to about 849 MHz).

The acoustic wave filter 40 is included as a receiving filter for LTE Band 26 (for example, reception band: about 859 MHz to about 894 MHz).

The common terminal 160 is connected with an input/output terminal 140 of the filter 50 and the input/output terminal 110 of the acoustic wave filter 40. The multiplexer 100 in this example is a duplexer for LTE Band 26.

The filter 50 includes the input/output terminal 140 (third input/output terminal) and an input/output terminal 150 (fourth input/output terminal). The filter 50 is a ladder acoustic wave filter including a plurality of acoustic wave resonators. The filter 50 includes a series-arm resonator 51s, a series-arm resonator 52s, a series-arm resonator 53s, a series-arm resonator 54s, a parallel-arm resonator 51p, a parallel-arm resonator 52p, and a parallel-arm resonator 53p. The series-arm resonators 51s, 52s, 53s, and 54s are in series on a path that provides a connection between the input/output terminals 140 and 150. Each of the parallel-arm resonators 51p, 52p, and 53p is connected between the corresponding node on the path and the ground. The filter 50 configured as described above is a band-pass filter whose passband is the transmission band of LTE Band 26, for example.

The circuit configuration of the acoustic wave filter 40 is configured as described above in relation to the preferred embodiment described above and uses acoustic waves or, more specifically, Love waves. With regard to the five IDT electrodes (the IDT electrodes 11 to 15) and the reflectors 19A and 19B included in the longitudinally coupled resonant portion 10 and the five IDT electrodes (the IDT electrodes 21 to 25) and the reflectors 29A and 29B included in the longitudinally coupled resonant portion 20, the electrode finger pitch P(k) varies as illustrated in FIG. 3. The standard deviation SD of the pitch deviation rate D(k) of the longitudinally coupled resonant portion 10 is about 2.92%. Similarly, the standard deviation SD of the pitch deviation rate D(k) of the longitudinally coupled resonant portion 20 is about 2.92%.

Figures 9A, 9B, 9C:
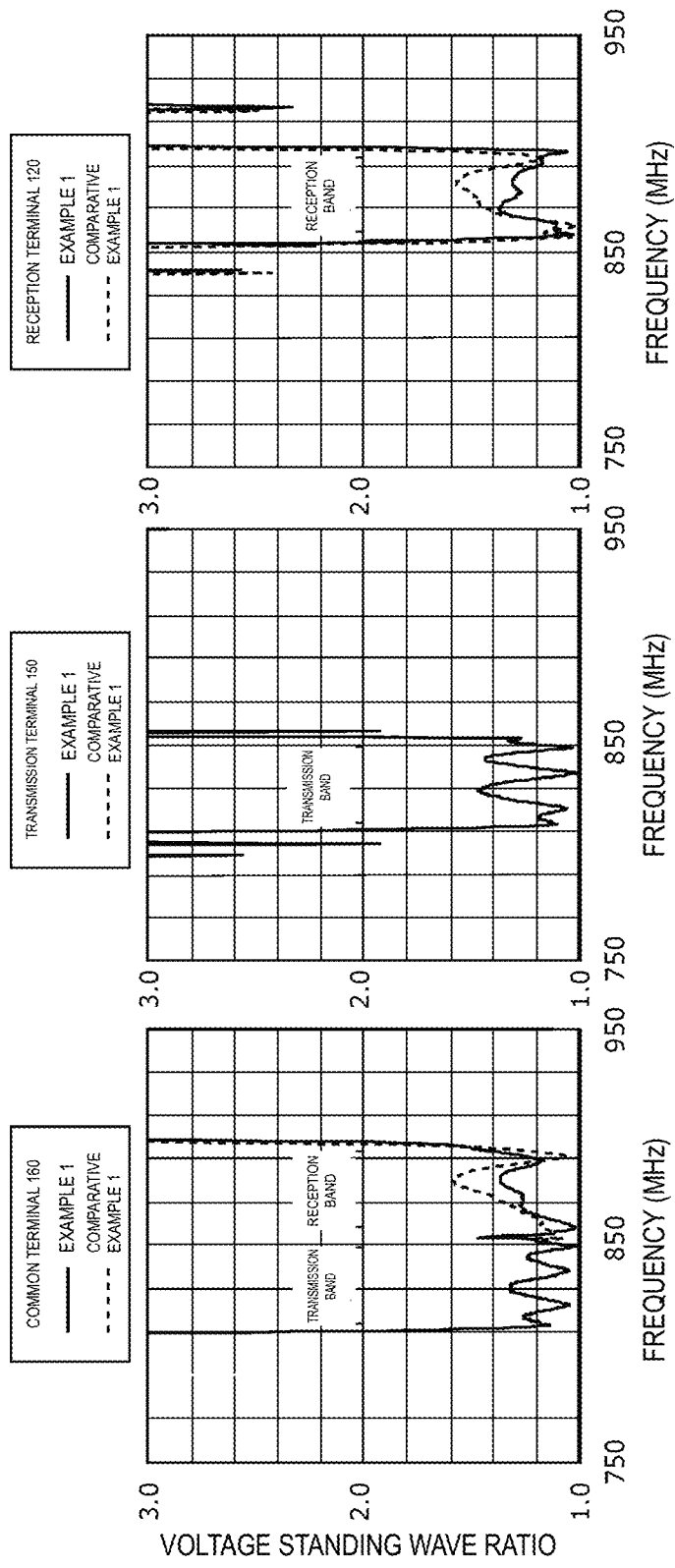
FIGS. 9A to 9C include graphs for comparing the voltage standing wave ratio of the multiplexer in Example 1 with that of the multiplexer in Comparative Example 1.

FIGS. 8A to 8C include graphs for comparing the band-pass characteristics and the isolation characteristics of the multiplexer in Example 1 with those of a multiplexer in Comparative Example 1. FIGS. 9A to 9C include graphs for comparing the voltage standing wave ratio of the multiplexer in Example 1 with that of the multiplexer in Comparative Example 1.

The circuit configuration of the multiplexer in Comparative Example 1 is similar to the circuit configuration of the multiplexer 100 in Example 1 illustrated in FIG. 7. The multiplexer in Comparative Example 1 differs from the multiplexer 100 in Example 1 in that the electrode finger pitch P(k) in the longitudinally coupled resonant portion included in the receiving filter (the acoustic wave filter 40) varies regularly. Thus, the standard deviation SD of the pitch deviation rate D(k) of the longitudinally coupled resonant portion included in the receiving filter in Comparative Example 1 is less than about 1.4%.

As shown in FIG. 8A, there is no difference between Example 1 and Comparative Example 1 in terms of the bandpass characteristics of the transmitting filter (the filter 50). The reason for this is that the transmitting filter in Example 1 and the transmitting filter in Comparative Example 1 have the same or substantially the same circuit configuration and the same or substantially the electrode finger configuration.

As shown in FIG. 8B, Example 1 is superior over Comparative Example 1 in the bandpass characteristics of the receiving filter or, more specifically, in the attenuation characteristics in the transmission band (in the region enclosed in the circle shown by a broken line in the graph).

As shown in FIG. 8C, Example 1 is superior over Comparative Example 1 in the isolation characteristics between the transmitting filter and the receiving filter or, more specifically, in the isolation characteristics in the transmission band (in the region enclosed in the circle shown by a broken line in the graph). This is due to the improved attenuation characteristics of the transmitting filter in Example 1.

There is no difference between Example 1 and Comparative Example 1 in terms of the bandpass characteristics of the receiving filter, the bandpass characteristics of the transmitting filter, and the isolation characteristics between the transmitting filter and the receiving filter (the acoustic wave filter 40) in the attenuation band in the frequency range lower than the transmission band of Band 26 and in the attenuation band in the frequency range higher than the reception band of Band 26. These attenuation bands are not illustrated in FIGS. 8A to 8C.

As can be seen from FIGS. 9A to 9C, the voltage standing wave ratios in the reception band on the input side and the output side of the receiving filter are smaller in Example 1 than in Comparative Example 1. This is an indication of superior impedance characteristics of the receiving filter in Example 1 over the impedance characteristics of the receiving filter in Comparative Example 1.

The superiority of Example 1 in the attenuation characteristics of the receiving filter, the impedance characteristics of the receiving filter, and the isolation characteristics between the receiving filter and the transmitting filter is due to the following factors: the electrode finger pitch P(k) in the longitudinally coupled resonant portion in Example 1 varies irregularly such that the standard deviation SD of the pitch deviation rate D(k) is increased, and as a result, excitation of spurious acoustic waves is reduced or prevented, and unwanted signals are reduced or prevented from propagating through the filters.

Figure 10:
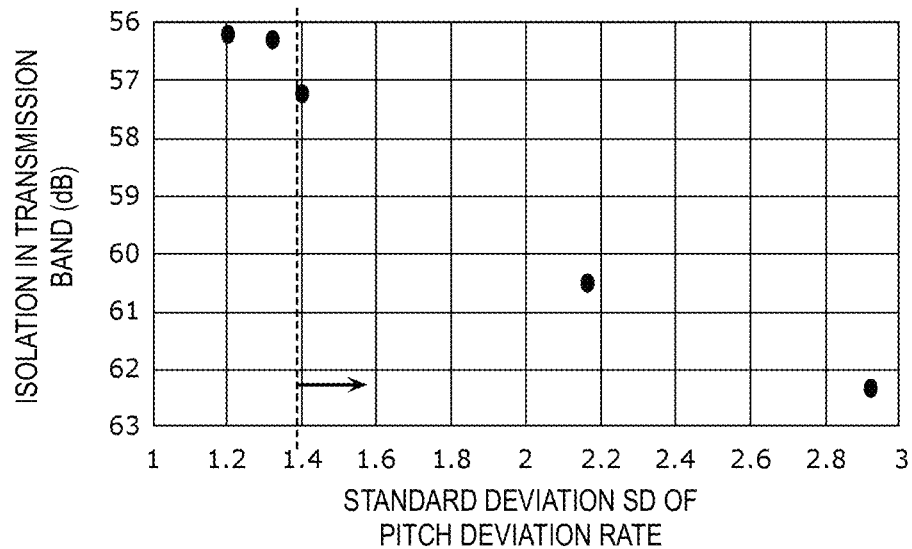
FIG. 10 is a graph illustrating the relationship between the standard deviation of the pitch deviation rate of a longitudinally coupled resonator and the isolation in a multiplexer according to a preferred embodiment of the present invention.

FIG. 10 is a graph illustrating the relationship between the standard deviation SD of the pitch deviation rate D(k) of the longitudinally coupled resonator 1 and the isolation in the multiplexer 100. With regard to the multiplexer 100 in Example 1, FIG. 10 illustrates the correlation between the standard deviation SD of the pitch deviation rate D(k) of the longitudinally coupled resonator 1 of the acoustic wave filter 40 and the isolation in the transmission band. It can be seen from FIG. 10 that the isolation in the transmission band increases (for example, by about 1 dB or more) when the standard deviation SD of the pitch deviation rate D(k) reaches or exceeds about 1.4%. It can also be seen from FIG. 10 that the isolation in the transmission band increases as the standard deviation SD increases within a range of about 1.4% to about 3.0%.

4. Configuration and Characteristics of Acoustic Wave Filter 40A in Example 2

Figure 11A:
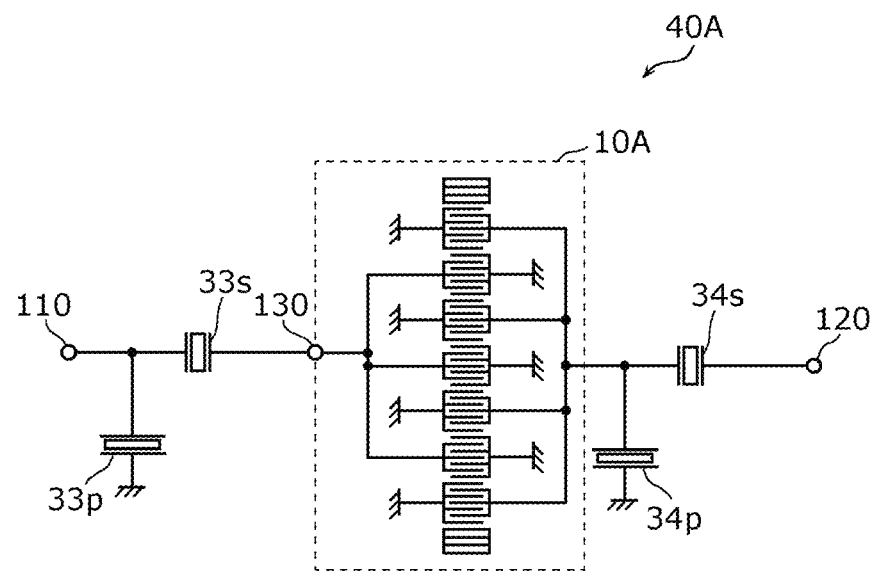
FIG. 11A is a circuit diagram of an acoustic wave filter in Example 2 of a preferred embodiment of the present invention.

FIG. 11A is a circuit configuration diagram of an acoustic wave filter 40A in Example 2 of a preferred embodiment of the present invention. As illustrated in FIG. 11A, the acoustic wave filter 40A includes a longitudinally coupled resonant portion 10A, a series-arm resonator 33s, a series-arm resonator 34s, a parallel-arm resonator 33p, a parallel-arm resonator 34p, an input/output terminal 110, and an input/output terminal 120. The acoustic wave filter 40A in Example 2 differs from the acoustic wave filter 40 in the preferred embodiment described above mainly in that the longitudinally coupled resonant portion 10A has a different configuration. Configurations common to the acoustic wave filter 40A in Example 2 and the acoustic wave filter 40 in the preferred embodiment described above will not be fully described in the following description, which will be provided while focusing on distinctive features of the acoustic wave filter 40A.

The series-arm resonators 33s and 34s are acoustic wave resonators in series on a path that provides a connection between the input/output terminal 110 and the input/output terminal 120. The parallel-arm resonators 33p and 34p are acoustic wave resonators, each of which is connected between the corresponding node on the path and the ground.

A longitudinally coupled resonant portion 10A includes seven IDT electrodes and two reflectors. The IDT electrodes are side by side on a piezoelectric substrate in the propagation direction of an acoustic wave. The seven reflectors are adjacent to the IDT electrodes in the propagation direction of the acoustic wave. The seven IDT electrodes, the two reflectors, and the piezoelectric substrate define a surface acoustic wave resonator. The seven IDT electrodes and the two reflectors each include electrode fingers Fe, which extend in a direction crossing the propagation direction of the acoustic wave and are in parallel or substantially in parallel.

The acoustic wave filter 40A uses acoustic waves or, more specifically, low-acoustic-velocity Rayleigh waves and is a band-pass filter whose passband is the reception band (for example, about 925 MHz to about 960 MHz) of LTE Band 8.

The electrode finger pitch P(k) of each of the seven IDT electrodes and the two reflectors of the longitudinally coupled resonant portion 10A varies irregularly, and the standard deviation SD of the pitch deviation rate D(k) of the longitudinally coupled resonant portion 10A is about 1.5%.

Figure 11B:
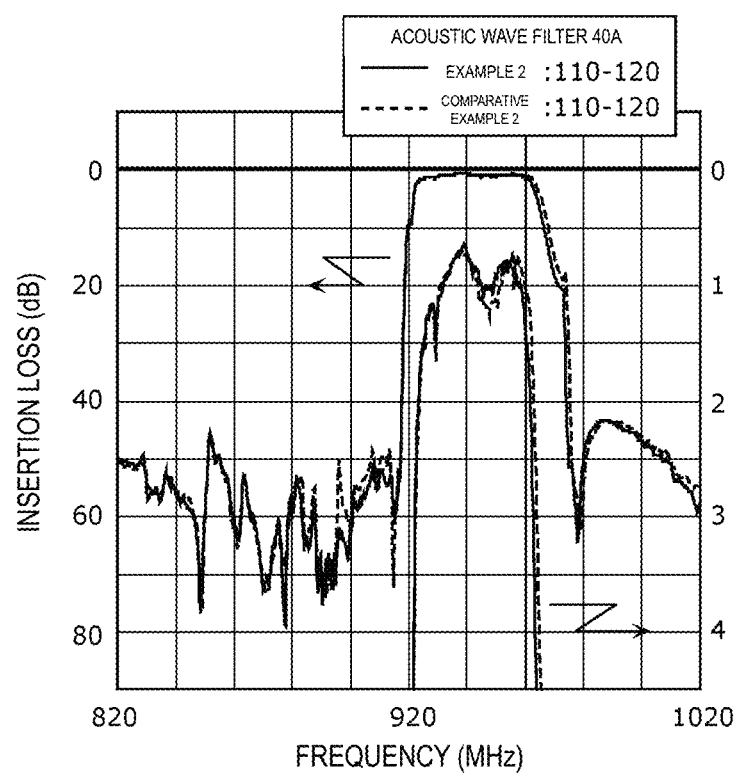
FIG. 11B is a graph for comparing the bandpass characteristics of the acoustic wave filter in Example 2 with the bandpass characteristics of an acoustic wave filter in Comparative Example 2.

FIG. 11B is a graph comparing the bandpass characteristics of the acoustic wave filter in Example 2 with the bandpass characteristics of an acoustic wave filter in Comparative Example 2.

The circuit configuration of the acoustic wave filter in Comparative Example 2 is similar to the circuit configuration of the acoustic wave filter 40A in Example 2 illustrated in FIG. 11A. The acoustic wave filter in Comparative Example 2 differs from the acoustic wave filter 40A in Example 2 in that the electrode finger pitch P(k) in the longitudinally coupled resonant portion 10A varies regularly. Thus, the standard deviation SD of the pitch deviation rate D(k) of the longitudinally coupled resonant portion 10A included in the acoustic wave filter in Comparative Example 2 is less than about 1.4%.

As can be seen from FIG. 11B, the acoustic wave filter 40A in Example 2 is superior to the acoustic wave filter in Comparative example 2 in terms of both the attenuation characteristics in the transmission band (for example, about 880 MHz to about 915 MHz) and the ripple reduction in the passband.

The ripple reduction in the passband is due to the following factors: the electrode finger pitch P(k) in the longitudinally coupled resonant portion 10A in Example 2 varies irregularly such that the standard deviation SD of the pitch deviation rate D(k) is increased, and as a result, excitation of spurious acoustic waves is reduced or prevented not only in the attenuation band but also in the passband.

5. Configuration and Characteristics of Multiplexer in Example 3

A multiplexer in Example 3 of a preferred embodiment of the present invention has a circuit configuration similar to that of the multiplexer 100 in Example 1 illustrated in FIG. 7. The difference between the multiplexer in Example 3 and the multiplexer 100 in Example 1 is in the variation pattern of the electrode finger pitch P(k) in the longitudinally coupled resonant portion included in the receiving filter.

Figure 12A:
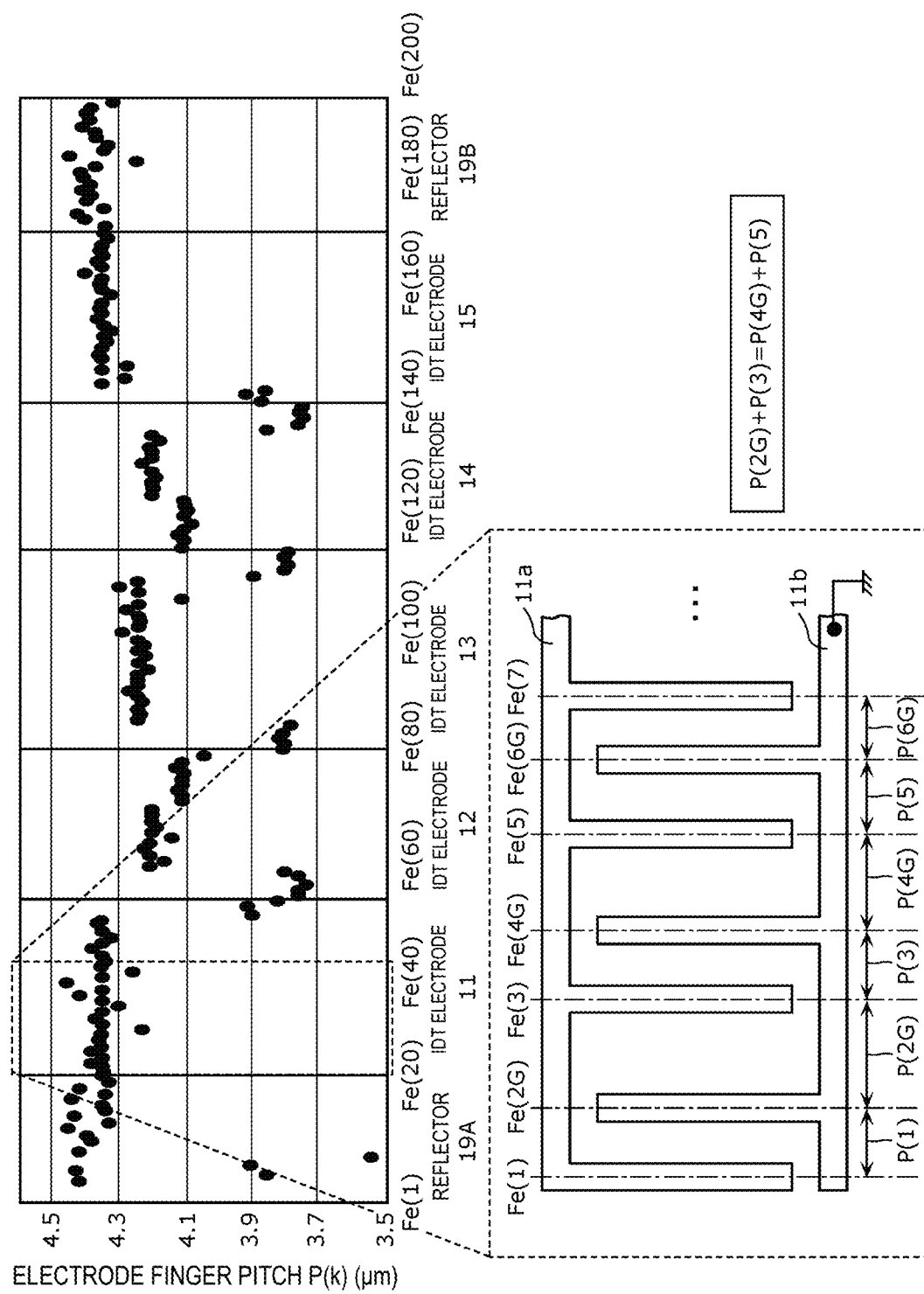
FIG. 12A is a graph illustrating the layout of electrode fingers and variations in the electrode finger pitch in a longitudinally coupled resonator included in an acoustic wave filter in Example 3 of a preferred embodiment of the present invention.

FIG. 12A is a graph illustrating the layout of electrode fingers and variations in the electrode finger pitch in the longitudinally coupled resonant portion 10 of the receiving filter (the acoustic wave filter 40) in Example 3. The electrode arrangement in a portion of the IDT electrode 11 included in the longitudinally coupled resonant portion 10 is illustrated in an enlarged manner in the lower section of FIG. 12A. The IDT electrode 11 includes a comb-shaped electrode 11a and a comb-shaped electrode 11b. The comb-shaped electrode 11a is an example of the first comb-shaped electrode supplied with signal potential (HOT), and the comb-shaped electrode 11b is an example of the second comb-shaped electrode connected to the ground. Electrode fingers of comb-shaped electrode 11a interdigitate with electrode fingers of the comb-shaped electrode 11b. The electrode fingers of the comb-shaped electrode 11a are denoted by Fe(1), Fe(3), Fe(5), Fe(7), and so on. The electrode fingers of the comb-shaped electrode 11b are denoted by Fe(2G), Fe(4G), Fe(6G), and so on.

The electrode finger pitch between adjacent ones of the electrode fingers Fe(1), Fe(3), Fe(5), Fe(7), . . . included in the comb-shaped electrode 11a varies irregularly. The electrode finger pitch between adjacent ones of the electrode fingers Fe(2G), Fe(4G), Fe(6G), . . . included in the comb-shaped electrode 11b is constant throughout the comb-shaped electrode 11b. The irregularity in the electrode finger pitch in the comb-shaped electrode 11a of the IDT electrode 11 and the regularity in the electrode finger pitch in the comb-shaped electrode 11b of the IDT electrode 11 are combined such that the standard deviation SD of the pitch deviation rate D(k) of the IDT electrode 11 as a whole is greater than or equal to about 1.4%.

More specifically, the standard deviation SD of the pitch deviation rate D(k) of the IDT electrode 11 as a whole is greater than or equal to about 1.4% and satisfies the following condition: P(2G)+P(3)=P(4G)+P(5), with P(1), P(2G), P(3), P(4G), P(5), P(6G), P(7), . . . being arranged in this order as illustrated in FIG. 12A.

As illustrated in the upper section of FIG. 12A, the electrode finger pitch P(k) of each of the IDT electrodes 12 to 15 and the reflectors 19A and 19B of the longitudinally coupled resonant portion 10 included in the receiving filter (the acoustic wave filter 40) of the multiplexer in this example varies as has been described in relation to the IDT electrode 11 in the preferred embodiment described above.

Figure 12B:
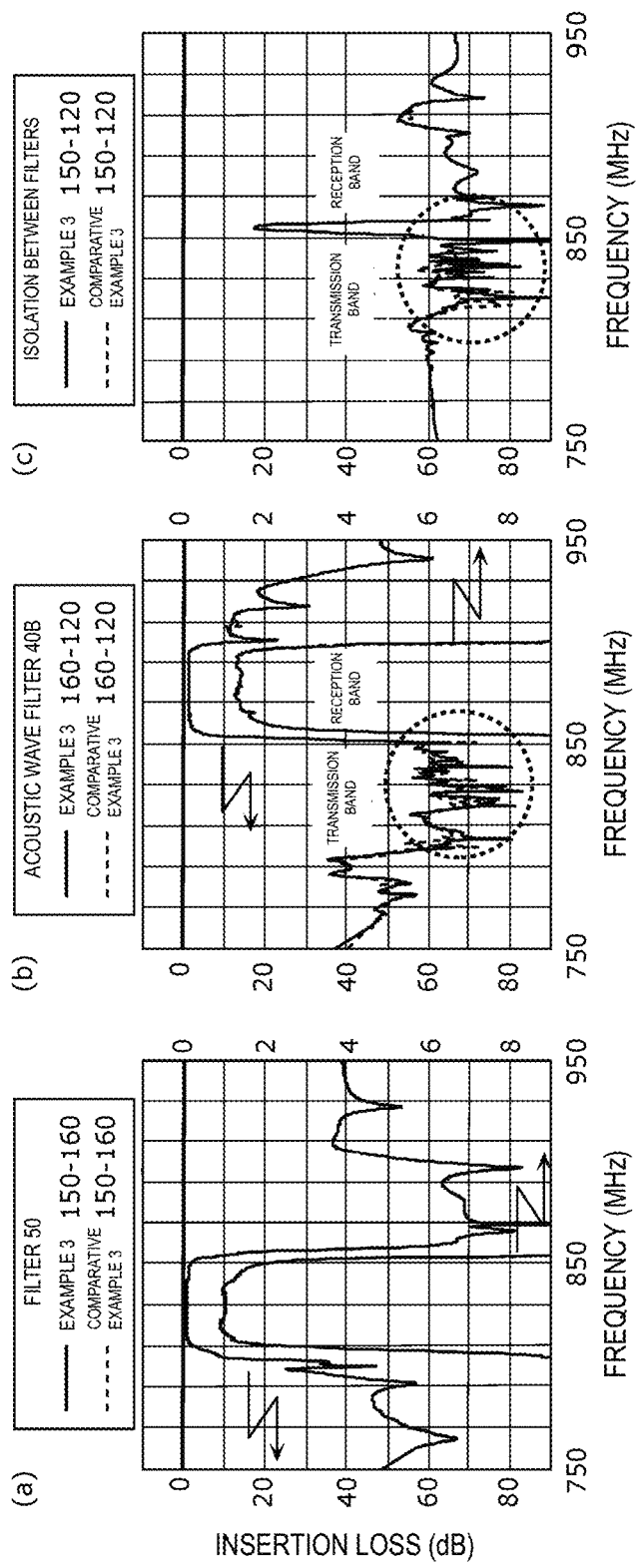
FIG. 12B includes graphs for comparing the bandpass characteristics and the isolation characteristics of the multiplexer in Example 3 with those of a multiplexer in Comparative Example 3.

FIG. 12B includes graphs for comparing the bandpass characteristics and the isolation characteristics of the multiplexer in Example 3 with those of a multiplexer in Comparative Example 3.

The circuit configuration of the multiplexer in Comparative Example 3 is similar to the circuit configuration of the multiplexer in Example 3. The multiplexer in Comparative Example 3 differs from the multiplexer in Example 3 in that the electrode finger pitch P(k) in the longitudinally coupled resonant portion included in the receiving filter (the acoustic wave filter 40) varies regularly. Thus, the standard deviation SD of the pitch deviation rate D(k) of the longitudinally coupled resonant portion included in the receiving filter in Comparative Example 3 is less than about 1.4%.

As shown in part (a) of FIG. 12B, there is no difference between Example 3 and Comparative Example 3 in terms of the bandpass characteristics of the transmitting filter (the filter 50). The reason for this is that the transmitting filter in Example 3 and the transmitting filter in Comparative Example 3 have the same or substantially the same circuit configuration and the same or substantially the same electrode finger configuration.

As shown in part (b) of FIG. 12B, Example 3 is superior over Comparative Example 3 in the bandpass characteristics of the receiving filter or, more specifically, in the attenuation characteristics in the transmission band (in the region enclosed in the circle shown by a broken line in the graph).

As shown in part (c) of FIG. 12B, Example 3 is superior over Comparative Example 3 in the isolation characteristics between the transmitting filter and the receiving filter or, more specifically, in the isolation characteristics in the transmission band (in the region enclosed in the circle shown by a broken line in the graph). This is due to the improved attenuation characteristics of the transmitting filter in Example 3.

The superiority of Example 3 in the attenuation characteristics of the receiving filter and the isolation characteristics between the receiving filter and the transmitting filter is due to the following factors: the electrode finger pitch P(k) in the longitudinally coupled resonant portion in Example 3 varies irregularly such that the standard deviation SD of the pitch deviation rate D(k) is increased, and as a result, excitation of spurious acoustic waves is reduced or prevented, and unwanted signals are reduced or prevented from propagating through the filters.

When the IDT electrodes are provided so as to have irregularity in the electrode finger pitch P(k), electrode-to-electrode variations in terms of the electrode finger pitch P(k) can be so significant that the bandpass characteristics will deteriorate. To reduce or prevent this, the electrode finger pitch P(k) of the comb-shaped electrode lib that is one of two comb-shaped electrodes included as a pair in the IDT electrode 11 and is connected to the ground is constant or substantially constant. At least the comb-shaped electrode lib may thus be provide so as to maintain the electrode finger pitch P(k) with high accuracy. In this way, the IDT electrodes reduce the electrode-to-electrode variations in terms of the electrode finger pitch P(k) and thus eliminate or reduce the possibility that the bandpass characteristics will deteriorate.

With regard to the layout of the electrode fingers, the IDT electrodes and the reflectors of the longitudinally coupled resonant portion included in the receiving filter of the multiplexer in this example have the following feature: the irregularity in the electrode finger pitch P(k) in the first comb-shaped electrode supplied with signal potential (HOT) and the regularity (consistency) in the electrode finger pitch P(k) in the second comb-shaped electrode connected to the ground are combined such that the standard deviation SD of the pitch deviation rate D(k) of each of the IDT electrodes and the reflectors is greater than or equal to about 1.4%. Alternatively, the IDT electrodes and the reflectors of the longitudinally coupled resonant portion may have the following feature: the irregularity in the electrode finger pitch P(k) in the second comb-shaped electrode connected to the ground and the regularity (consistency) in the electrode finger pitch P(k) in the first comb-shaped electrode supplied with signal potential (HOT) are combined such that the standard deviation SD of the pitch deviation rate D(k) of each of the IDT electrodes and the reflectors is greater than or equal to about 1.4%. In this way as well, the IDT electrodes are produced so as to reduce the electrode-to-electrode variations in terms of the electrode finger pitch P(k) and thus eliminate or reduce the possibility that the bandpass characteristics will deteriorate.

6. Configuration and Characteristics of Multiplexer in Example 4

Figure 13:
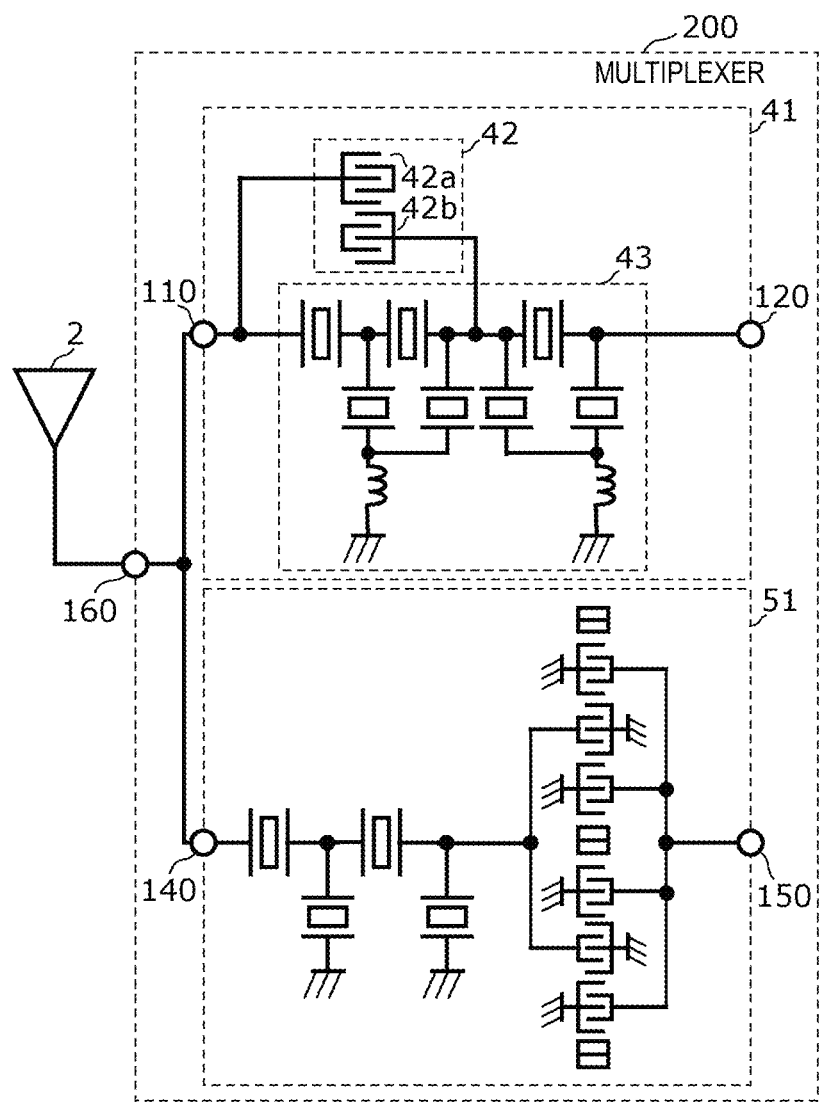
FIG. 13 is a configuration diagram illustrating a multiplexer and peripheral circuitry in Example 4 of a preferred embodiment of the present invention.

FIG. 13 is a configuration diagram illustrating a multiplexer 200 and peripheral circuitry in Example 4 of a preferred embodiment of the present invention. As illustrated in FIG. 13, the multiplexer 200 includes an acoustic wave filter 41, a filter 51, and a common terminal 160. The multiplexer 200 is connected to the common terminal 160 to connect to an antenna 2. An impedance matching circuit may be connected to a path that provides a connection between the common terminal 160 and the antenna 2.

The filter 51 is included as, for example, a receiving filter for LTE Band 26. The structure of the filter 51 may be freely selected.

The acoustic wave filter 41 is included as, for example, a transmitting filter for LTE Band 26.

The common terminal 160 is connected with an input/output terminal 140 of the filter 51 and an input/output terminal 110 of the acoustic wave filter 41. The multiplexer 200 in the present example is a duplexer for LTE Band 26.

The acoustic wave filter 41 includes a filter circuit 43 and a longitudinally coupled resonator 42.

The filter circuit 43 is provided on a piezoelectric substrate 60. The filter circuit 43 is connected the input/output terminal 110 and an input/output terminal 120 and includes one or more acoustic wave resonators. The passband of the filter circuit 43 is a first frequency band. The first frequency band is, for example, the transmission band of LTE Band 26.

The longitudinally coupled resonator 42 is provided on the substrate 60 and includes an IDT electrode 42a and an IDT electrode 42b, which are side by side in the propagation direction of an acoustic wave. The longitudinally coupled resonator 42 is an additional circuit connected to the input/output terminal 110 and to a node on a path that provides a connection between the input/output terminal 110 and the input/output terminal 120. The longitudinally coupled resonator 42 generates a signal opposite in phase to a signal component that is in a predetermined frequency band other than the first frequency band and that passes through the filter circuit 43. The longitudinally coupled resonator 42 is a longitudinally coupled surface acoustic wave resonator defined by a surface acoustic wave resonator including the IDT electrode 42a and a surface acoustic wave resonator including the IDT electrode 42b. One end (the IDT electrode 42a) of the longitudinally coupled resonator 42 is connected to the input/output terminal 110, and the other end (the IDT electrode 42b) is connected to a series arm of the filter circuit 43. With regard to the connection pattern of the longitudinally coupled resonator 42, the longitudinally coupled resonator 42 is connected to the respective nodes on a series-arm path that provides a connection between the input/output terminal 110 and the input/output terminal 120 of the filter circuit 43. The longitudinally coupled resonator 42 may include reflectors adjacent to the IDT electrodes 42a and 42b in the propagation direction of the acoustic wave. The longitudinally coupled resonator 42 may include three or more IDT electrodes. The longitudinally coupled resonator 42 may be, for example, a surface acoustic wave filter that includes a surface acoustic wave resonator including IDT electrodes. Alternatively, the longitudinally coupled resonator 42 may be, for example, a transversal resonator or a transversal filter.

The acoustic wave filter 41 configured as described above provides the following advantage: when a signal component generated by the longitudinally coupled resonator 42 and being in the predetermined frequency band is combined with a signal component that is to be cancelled after transmission through the filter circuit 43 (e.g., a signal component in the transmission band of LTE Band 26), the amplitude of the resultant signal is smaller than the amplitude of the signal component subject to be canceled. More preferably, the signal component generated by the longitudinally coupled resonator 42 for the purpose of cancellation is opposite in phase and equal or substantially equal in amplitude to the signal component that is to be cancelled after passing through the filter circuit 43.

According to the histogram, the standard deviation SD of the pitch deviation rate D(k) of at least one of the IDT electrodes 42a and 42b or that of at least one of the reflectors is greater than or equal to about 1.4%, for example.

Thus, an acoustic impedance mismatch is likely to occur while acoustic waves in the predetermined frequency band of the longitudinally coupled resonator 42 propagate on the substrate 60. The reason for this is that, for example, an acoustic wave excited by the electrode finger Fe(k) tends to be out of phase with an acoustic wave excited by the electrode finger Fe(k+2). In this state, excitation of acoustic waves in the predetermined frequency band can be reduced or prevented.

Figure 14:
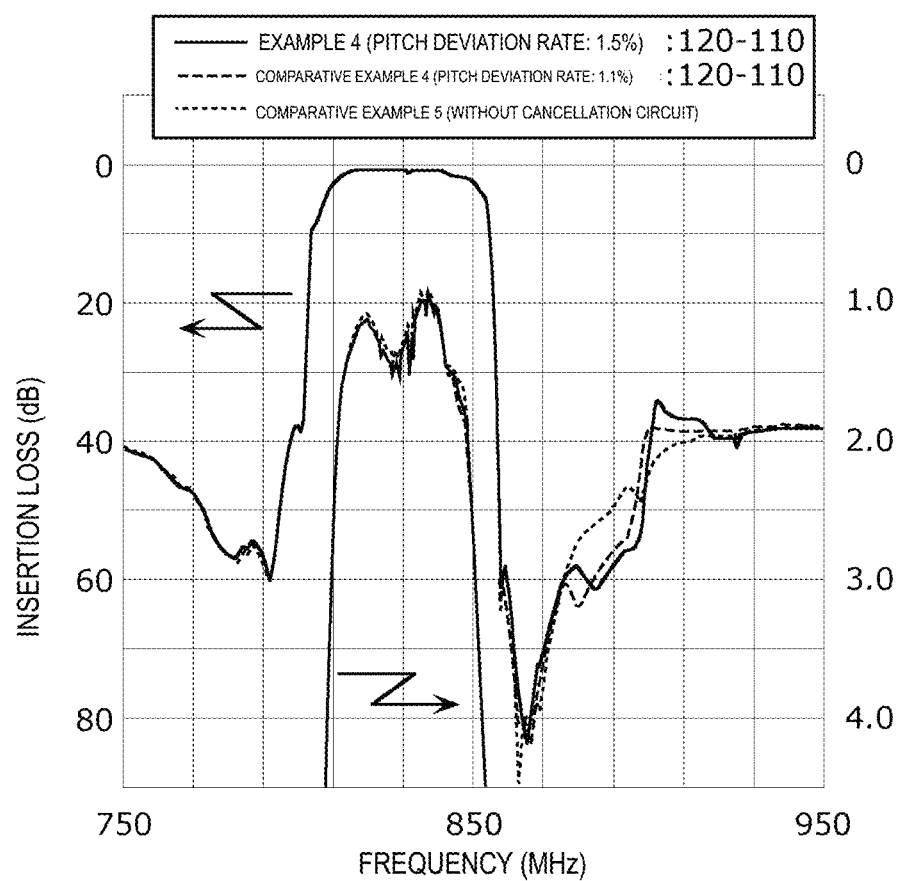
FIG. 14 is a graph for comparing the bandpass characteristics of the acoustic wave filter in Example 4 with the bandpass characteristics of an acoustic wave filter in Comparative Example 4 and with the bandpass characteristics of an acoustic wave filter according to Comparative Example 5.

FIG. 14 is a graph for comparing the bandpass characteristics of the acoustic wave filter in Example 4 with the bandpass characteristics of an acoustic wave filter in Comparative Example 4 and with the bandpass characteristics of an acoustic wave filter according to Comparative Example 5. The standard deviation SD of the pitch deviation rate D(k) of the acoustic wave filter 41 in Example 4 is about 1.5%. The circuit configuration of the acoustic wave filter in Comparative Example 4 differs from that of the acoustic wave filter 41 in Example 4 only in that the standard deviation SD of the pitch deviation rate D(k) is about 1.1%. The circuit configuration of the acoustic wave filter in Comparative Example 5 differs from that of the acoustic wave filter 41 in Example 4 only in that the longitudinally coupled resonator 42 is not included.

FIG. 14 illustrating the bandpass characteristics of each of the acoustic wave filters reveals that the acoustic wave filter 41 in Example 4 is superior to the acoustic wave filter in Comparative Example 4 and the acoustic wave filter in Comparative Example 5 in the following respects: the attenuation in the attenuation band (reception band) higher than the passband (transmission band) is greater, and the advantageous effect of increasing the attenuation in the attenuation band (reception band) is provided over a wider range of frequencies.

The increase in the attenuation in the attenuation band (reception band) of the acoustic wave filter 41 in Example 4 is due to a reduction in the ripple arising from the longitudinally coupled resonator 42 and being the cause of the low level of attenuation in the radio-frequency region in the attenuation band (reception band). The ripple reduction is attributable to the fact that the randomly pitched electrodes in the longitudinally coupled resonator 42 produce the advantageous effect of reducing or preventing out-of-band excitation. Another advantage of the acoustic wave filter 41 in Example 4, that is, the wider range of frequencies in which the attenuation in the attenuation band (reception band) is increased is also due to the randomly pitched electrodes or, more specifically, to the optimization of the characteristics of propagation between the IDT electrode 42a and the IDT electrode 42b of the longitudinally coupled resonator 42.

These improvements achieved by the acoustic wave filter 41 in relation to its attenuation band (reception band) provide more favorable isolation characteristics between the acoustic wave filter 41 and the filter 51 of the multiplexer 200.

7. Advantageous Effects

As described above, the acoustic wave filter 40 according to the present preferred embodiment includes the longitudinally coupled resonator 1. The longitudinally coupled resonator 1 includes the piezoelectric substrate 60, a plurality of IDT electrodes, and at least one reflector. The IDT electrodes are disposed on the substrate 60 and are side by side in the propagation direction of the acoustic wave. The reflector is adjacent to the IDT electrodes in the propagation direction of the acoustic wave. The plurality of IDT electrodes and the reflector each include a plurality of electrode fingers Fe, which extend in a direction crossing the propagation direction of the acoustic wave and are parallel or substantially in parallel. With the standard deviation SD of the pitch deviation rate $D(k)$ being determined based on the histogram, the standard deviation SD of the pitch deviation rate $D(k)$ of at least one of the reflector and the plurality of IDT electrodes is greater than or equal to about 1.4%, for example, where the definitions are as follows. (1) The k-th electrode finger pitch $P(k)$ is the distance between the electrode finger $Fe(k)$ and the electrode finger $Fe(k+1)$, k being an integer greater than or equal to 2. (2) When the electrodes $Fe(k-1)$, $Fe(k)$, and $Fe(k+1)$ are adjacent to each other, the pitch deviation rate $D(k)$ of the k-th electrode finger is obtained by dividing the difference between the electrode finger pitch $P(k)$ and the per-section average electrode finger pitch $PM(k)$ by the overall average electrode finger pitch PT. The per-section average electrode finger pitch $P(k)$ is the average of the electrode finger pitch $P(k-1)$ and the electrode finger pitch $P(k+1)$. The overall average electrode finger pitch PT is the average pitch of all of the electrode fingers of the IDT electrode or the reflector including the three adjacent electrode fingers. (3) The histogram illustrates variations in the pitch deviation rate $D(k)$ and is obtained such that the pitch deviation rate $D(k)$ of the k-th electrode finger $Fe(k)$ is determined by calculation for every one of the electrode fingers of the IDT electrode or the reflector including the three adjacent electrode fingers.

Thus, an acoustic impedance mismatch is likely to occur while acoustic waves in frequency bands outside the passband of the acoustic wave filter 40 propagate on the substrate 60. The reason for this is that, for example, an acoustic wave excited by the electrode finger $Fe(k)$ tends to be out of phase with an acoustic wave excited by the electrode finger $Fe(k+2)$. In this state, excitation of the acoustic waves of frequencies in the frequency band outside the passband of the acoustic wave filter 40 may be reduced or prevented. With the electrode fingers $Fe(k)$ and $Fe(k+2)$ being included in an IDT electrode on the input side, the acoustic wave excited by the electrode finger $Fe(k)$ is out of phase with the acoustic wave excited by the electrode finger $Fe(k+2)$, and for this reason, these acoustic waves cannot be picked up by an IDT electrode on the output side in an efficient manner. The attenuation characteristics of the acoustic wave filter 40 may be improved accordingly.

The plurality of IDT electrodes each include a first comb-shaped electrode and a second comb-shaped electrode. The first comb-shaped electrode includes some of the plurality of electrode fingers Fe and a busbar electrode that provides a connection between first ends of the electrode fingers Fe included in the first comb-shaped electrode. The second comb-shaped electrode includes the other ones of the plurality of electrode fingers Fe and a busbar electrode that provides a connection between second ends of the electrode fingers Fe included in the second comb-shaped electrode. The second comb-shaped electrode is connected to a ground. The electrode fingers Fe of the first comb-shaped electrode interdigitate with the electrode fingers Fe of the second comb-shaped electrode. According to the histogram, the standard deviation SD of the pitch deviation rate $D(k)$ of at least one of the plurality of IDT electrodes may be greater than or equal to about 1.4%, for example, and the electrode finger pitch between adjacent ones of the electrode fingers Fe of the second comb-shaped electrode of the at least one of the plurality of IDT electrodes may be constant or substantially constant throughout the second comb-shaped electrode.

When the IDT electrodes are produced so as to have irregularity in the electrode finger pitch $P(k)$, electrode-to-electrode variations in terms of the electrode finger pitch $P(k)$ can be so significant that the bandpass characteristics in particular will deteriorate. To reduce or prevent this, the electrode finger pitch $P(k)$ of the second comb-shaped electrode that is one of two comb-shaped electrodes included the IDT electrode and is connected to the ground is constant or substantially constant. The second comb-shaped electrode may thus be provided so as to maintain the electrode finger pitch $P(k)$ with high accuracy. This configuration thus eliminates or reduces the possibility that the bandpass characteristics will deteriorate.

According to the histogram, the standard deviation SD of the pitch deviation rate $D(k)$ of at least one of the plurality of IDT electrodes may be greater than or equal to about 1.4%, for example, and the electrode finger pitch $P(k)$ between adjacent ones of the electrode fingers of the first comb-shaped electrode of the at least one of the IDT electrodes may be constant or substantially constant throughout the first comb-shaped electrode.

The electrode finger pitch $P(k)$ of the first comb-shaped electrode that is one of two comb-shaped electrodes included the IDT electrode and is supplied with signal potential (HOT) is constant or substantially constant. The first comb-shaped electrode may thus be provided so as to maintain the electrode finger pitch $P(k)$ with high accuracy. This configuration thus eliminates or reduces the possibility that the bandpass characteristics will deteriorate.

According to the histogram, the standard deviation SD of the pitch deviation rate $D(k)$ of at least one of the plurality of IDT electrodes may be greater than or equal to about 1.4%, for example, and the standard deviation SD of the pitch deviation rate $D(k)$ of the reflector may be less than about 1.4%, for example.

The reflector may thus be provided so as to reduce or minimize variations in the electrode finger pitch $P(k)$. This improves the stability of attenuation poles outside the attenuation band specified in accordance with the resonance action of the reflector.

According to the histogram, the standard deviation SD of the pitch deviation rate D(k) of one of the plurality of IDT electrodes may be greater than or equal to about 1.4%, for example, and the standard deviation SD of the pitch deviation rate D(k) of each of the other IDT electrodes may be less than about 1.4%, for example.

That is, the electrode finger pitch of an IDT electrode more pertinent than the other IDT electrodes to the attenuation characteristics may vary irregularly such that the attenuation characteristics may be improved. Meanwhile, the electrode finger pitch of each of the other IDT electrodes may vary regularly. These IDT electrodes may be provided so as to reduce or minimize electrode-to-electrode variations, thus eliminating or reducing the possibility that the characteristics will deteriorate.

According to the histogram, the standard deviation SD of the pitch deviation rate D(k) of each of the plurality of IDT electrodes may less than about 1.4%, and the standard deviation SD of the pitch deviation rate D(k) of the reflector may be greater than or equal to about 1.4%, for example.

The IDT electrodes may thus be provided so as to reduce or minimize electrode-to-electrode variations in terms of the electrode finger pitch. This enables the stability of the insertion loss in the passband.

The acoustic wave filter 41 may include the piezoelectric substrate 60, the filter circuit 43, and the longitudinally coupled resonator 42. The filter circuit 43 is provided on the substrate 60 and is connected to the input/output terminals 110 and 120. The filter circuit 43 includes at least one acoustic wave resonator. The passband of the filter circuit is the first frequency band. The longitudinally coupled resonator 42 is provided on the substrate 60 and includes the IDT electrodes 42a and 42b side by side in the propagation direction of the acoustic wave. The longitudinally coupled resonator 42 is connected to at least one of the input/output terminal 110, the input/output terminal 120, and a path that provides a connection between the input/output terminal 110 and the input/output terminal 120. The longitudinally coupled resonator 42 is configured to generate a signal out of phase with a signal component that is in a predetermined frequency band other than the first frequency band and that passes through the filter circuit 43. The IDT electrodes 42a and 42b each include a plurality of electrode fingers that extend in a direction crossing the propagation direction of the acoustic wave and that are in parallel or substantially in parallel. According to the histogram, the standard deviation of the pitch deviation rate D(k) of at least one of the IDT electrodes 42a and 42b may be greater than or equal to about 1.4%, for example.

These features enable an increase in the attenuation in a predetermined attenuation band of the filter circuit 43 and are advantages in that an increased attenuation in the attenuation band is provided over a wider range of frequencies.

The multiplexer 100 according to the present preferred embodiment includes the common terminal 160, the acoustic wave filter 40 and the filter 50. The acoustic wave filter 40 includes the input/output terminals 110 and 120. The filter 50 includes the input/output terminals 140 and 150. The acoustic wave filter 40 and the filter have different passbands. The common terminal 160 is connected to the input/output terminals 110 and 140.

These features provide more favorable isolation characteristics between the acoustic wave filter 40 and the filter 50 of the multiplexer 100.

Other Modifications

Although preferred embodiments of the present invention and examples thereof have been described regarding the acoustic wave filter and the multiplexer according to preferred embodiments of the present invention, the acoustic wave filters and the multiplexers according to the present invention are not limited to the preferred embodiments and examples described above. The present invention includes other preferred embodiments provided by varying combinations of components of the preferred embodiments and examples, other modifications achieved through various alterations that may be made to the preferred embodiments and examples by those skilled in the art within a range not departing from the spirit of the present invention, and various apparatuses including the acoustic wave filter and the multiplexer according to any one of the preferred embodiments and examples.

According to the description of the preferred embodiments and examples, the multiplexer is, for example, a duplexer for LTE Band 26, and the acoustic wave filter is, for example, a receiving filter for LTE Band 8. Alternatively, the present invention may be used for communication bands other than LTE Band 8 and LTE Band 26. It is not necessary that the multiplexer is a duplexer. The multiplexer may be, for example, a triplexer including three filters all connected to the same antenna or may be a hexaplexer including three duplexers all connected to the same common terminal. That is, only at least two filters need to be included in the multiplexer.

It is not necessary that both a transmitting filter and a receiving filter are included in the multiplexer. The multiplexer may include only transmitting filters or may include only receiving filters.

In each of the acoustic wave filters and the multiplexers according to preferred embodiments and examples described above, the paths that provide connections between the circuit elements (and components) and the signal paths illustrated in the drawings may include, for example, other circuit elements and wiring disposed thereon.

Preferred embodiments of the present invention are widely applicable to transmit-receive filters and multiplexers that are to be included in front-end portions of wireless communications terminals to meet the need of both the low-loss performance in the passband and high levels of out-of-band attenuation.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An acoustic wave filter comprising:
    a longitudinally coupled resonator including a piezoelectric substrate, a plurality of interdigital transducer (IDT) electrodes on the piezoelectric substrate and being side by side in a propagation direction of an acoustic wave, and a reflector adjacent to the plurality of IDT electrodes in the propagation direction of the acoustic wave; wherein
    the plurality of IDT electrodes and the reflector each include a plurality of electrode fingers extending in a direction crossing the propagation direction of the acoustic wave and being in parallel or substantially in parallel;
    with a standard deviation of a pitch deviation rate being determined based on a histogram, the standard deviation of the pitch deviation rate of at least one of the reflector and the plurality of IDT electrodes is greater than or equal to about 1.4%, where a k-th electrode finger pitch is a distance between a k-th electrode finger and a (k+1)th electrode finger in the propagation direction of the acoustic wave, k being an integer greater than or equal to 2;

when a (k−1)th electrode finger, the k-th electrode finger, and the (k+1)th electrode finger are adjacent to each other, the pitch deviation rate of the k-th electrode finger is obtained by dividing a difference between the k-th electrode finger pitch and a per-section average electrode finger pitch by an overall average electrode finger pitch, the per-section average electrode finger pitch being an average of a (k−1)th electrode finger pitch and a (k+1)th electrode finger pitch, the overall average electrode finger pitch being an average pitch of all of the plurality of electrode fingers of the at least one of the plurality of IDT electrodes and the reflector including the three adjacent electrode fingers; and the histogram provides variations in the pitch deviation rate and is obtained such that the pitch deviation rate of the k-th electrode finger is determined by calculation for every one of the plurality of electrode fingers of the at least one of the plurality of IDT electrodes and the reflector including the three adjacent electrode fingers.

2. The acoustic wave filter according to claim 1, wherein each of the plurality of IDT electrodes includes:
   a first comb-shaped electrode including some of the plurality of electrode fingers and a busbar electrode connecting first ends of the electrode fingers included in the first comb-shaped electrode;
   a second comb-shaped electrode including other ones of the plurality of electrode fingers and a busbar electrode connecting second ends of the electrode fingers included in the second comb-shaped electrode, the second comb-shaped electrode being connected to a ground;
   the electrode fingers of the first comb-shaped electrode interdigitate with the electrode fingers of the second comb-shaped electrode; and
   the standard deviation of the pitch deviation rate of at least one of the plurality of IDT electrodes is greater than or equal to about 1.4%, and the electrode finger pitch between adjacent ones of the electrode fingers of the second comb-shaped electrode of the at least one of the plurality of IDT electrodes is constant or substantially constant throughout the second comb-shaped electrode.

3. The acoustic wave filter according to claim 1, wherein each of the plurality of IDT electrodes includes:
   a first comb-shaped electrode including some of the plurality of electrode fingers and a busbar electrode connecting first ends of the electrode fingers included in the first comb-shaped electrode;
   a second comb-shaped electrode including other ones of the plurality of electrode fingers and a busbar electrode connecting second ends of the electrode fingers included in the second comb-shaped electrode, the second comb-shaped electrode being connected to a ground;
   the electrode fingers of the first comb-shaped electrode interdigitate with the electrode fingers of the second comb-shaped electrode; and
   the standard deviation of the pitch deviation rate of at least one of the plurality of IDT electrodes is greater than or equal to about 1.4%, and the electrode finger pitch between adjacent ones of the electrode fingers of the first comb-shaped electrode of the at least one of the plurality of IDT electrodes is constant or substantially throughout the first comb-shaped electrode.

4. The acoustic wave filter according to claim 1, wherein the standard deviation of the pitch deviation rate of at least one of the plurality of IDT electrodes is greater than or equal to about 1.4%, and the standard deviation of the pitch deviation rate of the reflector is less than about 1.4%.

5. The acoustic wave filter according to claim 1, wherein the standard deviation of the pitch deviation rate of one of the plurality of IDT electrodes is greater than or equal to about 1.4%, and the standard deviation of the pitch deviation rate of each of remaining ones of the plurality of IDT electrodes is less than about 1.4%.

6. The acoustic wave filter according to claim 1, wherein the standard deviation of the pitch deviation rate of each of the plurality of IDT electrodes is less than about 1.4%, and the standard deviation of the pitch deviation rate of the reflector is greater than or equal to about 1.4%.

7. A multiplexer, comprising:
   a common terminal;
   the acoustic wave filter according to claim 1, the acoustic wave filter including a first input/output terminal and a second input/output terminal; and
   a first filter including a third input/output terminal and a fourth input/output terminal, the first filter and the acoustic wave filter with different passbands; wherein
   the common terminal is connected to the first input/output terminal and the third input/output terminal.

8. The multiplexer according to claim 7, wherein each of the plurality of IDT electrodes includes:
   a first comb-shaped electrode including some of the plurality of electrode fingers and a busbar electrode connecting first ends of the electrode fingers included in the first comb-shaped electrode;
   a second comb-shaped electrode including other ones of the plurality of electrode fingers and a busbar electrode connecting second ends of the electrode fingers included in the second comb-shaped electrode, the second comb-shaped electrode being connected to a ground;
   the electrode fingers of the first comb-shaped electrode interdigitate with the electrode fingers of the second comb-shaped electrode; and
   the standard deviation of the pitch deviation rate of at least one of the plurality of IDT electrodes is greater than or equal to about 1.4%, and the electrode finger pitch between adjacent ones of the electrode fingers of the second comb-shaped electrode of the at least one of the plurality of IDT electrodes is constant or substantially constant throughout the second comb-shaped electrode.

9. The multiplexer according to claim 7, wherein each of the plurality of IDT electrodes includes:
   a first comb-shaped electrode including some of the plurality of electrode fingers and a busbar electrode connecting first ends of the electrode fingers included in the first comb-shaped electrode;
   a second comb-shaped electrode including other ones of the plurality of electrode fingers and a busbar electrode connecting second ends of the electrode fingers included in the second comb-shaped electrode, the second comb-shaped electrode being connected to a ground;
   the electrode fingers of the first comb-shaped electrode interdigitate with the electrode fingers of the second comb-shaped electrode; and the standard deviation of the pitch deviation rate of at least one of the plurality of IDT electrodes is greater than or equal to about 1.4%, and the electrode finger pitch between adjacent ones of the electrode fingers of the first comb-shaped electrode of the at least one of the plurality of IDT electrodes is constant or substantially throughout the first comb-shaped electrode.

10. The multiplexer according to claim 7, wherein the standard deviation of the pitch deviation rate of at least one of the plurality of IDT electrodes is greater than or equal to about 1.4%, and the standard deviation of the pitch deviation rate of the reflector is less than about 1.4%.

11. The multiplexer according to claim 7, wherein the standard deviation of the pitch deviation rate of one of the plurality of IDT electrodes is greater than or equal to about 1.4%, and the standard deviation of the pitch deviation rate of each of remaining ones of the plurality of IDT electrodes is less than about 1.4%.

12. The multiplexer according to claim 7, wherein the standard deviation of the pitch deviation rate of each of the plurality of IDT electrodes is less than about 1.4%, and the standard deviation of the pitch deviation rate of the reflector is greater than or equal to about 1.4%.

13. An acoustic wave filter comprising:
a piezoelectric substrate;
a filter circuit on the piezoelectric substrate and connected to a first input/output terminal and a second input/output terminal, the filter circuit including an acoustic wave resonator, a passband of the filter circuit being a first frequency band; and
a longitudinally coupled resonator on the piezoelectric substrate and including a plurality of IDT electrodes side by side in a propagation direction of an acoustic wave, the longitudinally coupled resonator being connected to at least one of the first input/output terminal, the second input/output terminal, and a path providing a connection between the first input/output terminal and the second input/output terminal, the longitudinally coupled resonator being configured to generate a signal out of phase with a signal component that is in a predetermined frequency band other than the first frequency band and that passes through the filter circuit; wherein
each of the plurality of IDT electrodes includes a plurality of electrode fingers extending in a direction crossing the propagation direction of the acoustic wave and in parallel or substantially in parallel;
with a standard deviation of a pitch deviation rate being determined based on a histogram, the standard deviation of the pitch deviation rate of at least one of the plurality of IDT electrodes is greater than or equal to about 1.4%,
where
a k-th electrode finger pitch is a distance between a k-th electrode finger and a (k+1)th electrode finger in the propagation direction of the acoustic wave, k being an integer greater than or equal to 2;
when a (k−1)th electrode finger, the k-th electrode finger, and the (k+1)th electrode finger are adjacent to each other, the pitch deviation rate of the k-th electrode finger is obtained by dividing a difference between the k-th electrode finger pitch and a per-section average electrode finger pitch by an overall average electrode finger pitch, the per-section average electrode finger pitch being an average of a (k−1)th electrode finger pitch and a (k+1)th electrode finger pitch, the overall average electrode finger pitch being an average pitch of all of the electrode fingers of the IDT electrode including the three adjacent electrode fingers; and
the histogram illustrates variations in the pitch deviation rate and is obtained such that the pitch deviation rate of the k-th electrode finger is determined by calculation for every one of the electrode fingers of the IDT electrode including the three adjacent electrode fingers.

14. The acoustic wave filter according to claim 13, wherein
each of the plurality of IDT electrodes includes:
a first comb-shaped electrode including some of the plurality of electrode fingers and a busbar electrode connecting first ends of the electrode fingers included in the first comb-shaped electrode;
a second comb-shaped electrode including other ones of the plurality of electrode fingers and a busbar electrode connecting second ends of the electrode fingers included in the second comb-shaped electrode, the second comb-shaped electrode being connected to a ground;
the electrode fingers of the first comb-shaped electrode interdigitate with the electrode fingers of the second comb-shaped electrode; and
the standard deviation of the pitch deviation rate of at least one of the plurality of IDT electrodes is greater than or equal to about 1.4%, and the electrode finger pitch between adjacent ones of the electrode fingers of the second comb-shaped electrode of the at least one of the plurality of IDT electrodes is constant or substantially constant throughout the second comb-shaped electrode.

15. The acoustic wave filter according to claim 13, wherein
each of the plurality of IDT electrodes includes:
a first comb-shaped electrode including some of the plurality of electrode fingers and a busbar electrode connecting first ends of the electrode fingers included in the first comb-shaped electrode;
a second comb-shaped electrode including other ones of the plurality of electrode fingers and a busbar electrode connecting second ends of the electrode fingers included in the second comb-shaped electrode, the second comb-shaped electrode being connected to a ground;
the electrode fingers of the first comb-shaped electrode interdigitate with the electrode fingers of the second comb-shaped electrode; and
the standard deviation of the pitch deviation rate of at least one of the plurality of IDT electrodes is greater than or equal to about 1.4%, and the electrode finger pitch between adjacent ones of the electrode fingers of the first comb-shaped electrode of the at least one of the plurality of IDT electrodes is constant or substantially throughout the first comb-shaped electrode.

16. The acoustic wave filter according to claim 13, wherein the standard deviation of the pitch deviation rate of one of the plurality of IDT electrodes is greater than or equal to about 1.4%, and the standard deviation of the pitch deviation rate of each of remaining ones of the plurality of IDT electrodes is less than about 1.4%.

17. A multiplexer, comprising:
a common terminal;
the acoustic wave filter according to claim 13, the acoustic wave filter including a first input/output terminal and a second input/output terminal; and a first filter including a third input/output terminal and a fourth input/output terminal, the first filter and the acoustic wave filter having different passbands; wherein the common terminal is connected to the first input/output terminal and the third input/output terminal.

18. The multiplexer according to claim 17, wherein each of the plurality of IDT electrodes includes:
   a first comb-shaped electrode including some of the plurality of electrode fingers and a busbar electrode connecting first ends of the electrode fingers included in the first comb-shaped electrode;
   a second comb-shaped electrode including other ones of the plurality of electrode fingers and a busbar electrode connecting second ends of the electrode fingers included in the second comb-shaped electrode, the second comb-shaped electrode being connected to a ground;
   the electrode fingers of the first comb-shaped electrode interdigitate with the electrode fingers of the second comb-shaped electrode; and
   the standard deviation of the pitch deviation rate of at least one of the plurality of IDT electrodes is greater than or equal to about 1.4%, and the electrode finger pitch between adjacent ones of the electrode fingers of the second comb-shaped electrode of the at least one of the plurality of IDT electrodes is constant or substantially constant throughout the second comb-shaped electrode.

19. The multiplexer according to claim 17, wherein each of the plurality of IDT electrodes includes:
   a first comb-shaped electrode including some of the plurality of electrode fingers and a busbar electrode connecting first ends of the electrode fingers included in the first comb-shaped electrode;
   a second comb-shaped electrode including other ones of the plurality of electrode fingers and a busbar electrode connecting second ends of the electrode fingers included in the second comb-shaped electrode, the second comb-shaped electrode being connected to a ground;
   the electrode fingers of the first comb-shaped electrode interdigitate with the electrode fingers of the second comb-shaped electrode; and
   the standard deviation of the pitch deviation rate of at least one of the plurality of IDT electrodes is greater than or equal to about 1.4%, and the electrode finger pitch between adjacent ones of the electrode fingers of the first comb-shaped electrode of the at least one of the plurality of IDT electrodes is constant or substantially throughout the first comb-shaped electrode.

20. The multiplexer according to claim 17, wherein the standard deviation of the pitch deviation rate of one of the plurality of IDT electrodes is greater than or equal to about 1.4%, and the standard deviation of the pitch deviation rate of each of remaining ones of the plurality of IDT electrodes is less than about 1.4%.

* * * * *